(12) United States Patent
Lee

(10) Patent No.: US 6,995,424 B2
(45) Date of Patent: Feb. 7, 2006

(54) NON-VOLATILE MEMORY DEVICES WITH CHARGE STORAGE INSULATORS

(75) Inventor: Chang-Hyun Lee, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/712,426

(22) Filed: Nov. 13, 2003

(65) Prior Publication Data

US 2004/0135194 A1    Jul. 15, 2004

(30) Foreign Application Priority Data

Jan. 10, 2003   (KR) .................... 10-2003-0001566

(51) Int. Cl.
*H01L 29/792* (2006.01)

(52) U.S. Cl. ............... 257/324; 257/314; 257/315; 257/316; 257/320; 257/321; 257/322; 257/326

(58) Field of Classification Search ............. None
See application file for complete search history.

(56) References Cited

U.S. PATENT DOCUMENTS

| | | | | |
|---|---|---|---|---|
| 5,188,976 | A | * | 2/1993 | Kume et al. ............ 438/258 |
| 6,306,690 | B1 | * | 10/2001 | Kaya et al. ............. 438/136 |
| 6,440,798 | B1 | * | 8/2002 | Lai et al. ................ 438/266 |
| 6,759,706 | B2 | * | 7/2004 | Kobayashi ............. 257/314 |
| 6,781,193 | B2 | * | 8/2004 | Lee et al. ............... 257/326 |

FOREIGN PATENT DOCUMENTS

| KR | 2002-0094505 | * | 12/2002 |
|---|---|---|---|
| KR | 2003-0001088 | * | 1/2003 |

OTHER PUBLICATIONS

Notice to File a Response, Korean Application No. 10-2003-0001566, Nov. 29, 2004.*

* cited by examiner

*Primary Examiner*—Andy Huynh
(74) *Attorney, Agent, or Firm*—Myers Bigel Sibley & Sajovec

(57) ABSTRACT

A non-volatile memory device comprises a cell region defined at a substrate and a plurality of device isolation layers formed in the cell region to define a plurality of active regions. A charge storage insulator covers substantially the entire top surface of the cell region. A plurality of gate lines are formed on the charge storage insulator that cross over the device isolation layers. Conductive patterns are disposed between predetermined gate lines that penetrate the charge storage insulator to electrically connect with the active regions. According to the method of fabricating the device, a plurality of device isolation layers are formed in the substrate and then a charge storage insulator is formed on an entire surface of the substrate and the device isolation layers. A plurality of parallel gate lines that cross over the device isolation layers are formed on the charge storage insulator and then conductive patterns are formed between predetermined gate lines. The conductive patterns penetrate the charge storage insulator and electrically connect with the active regions.

33 Claims, 28 Drawing Sheets

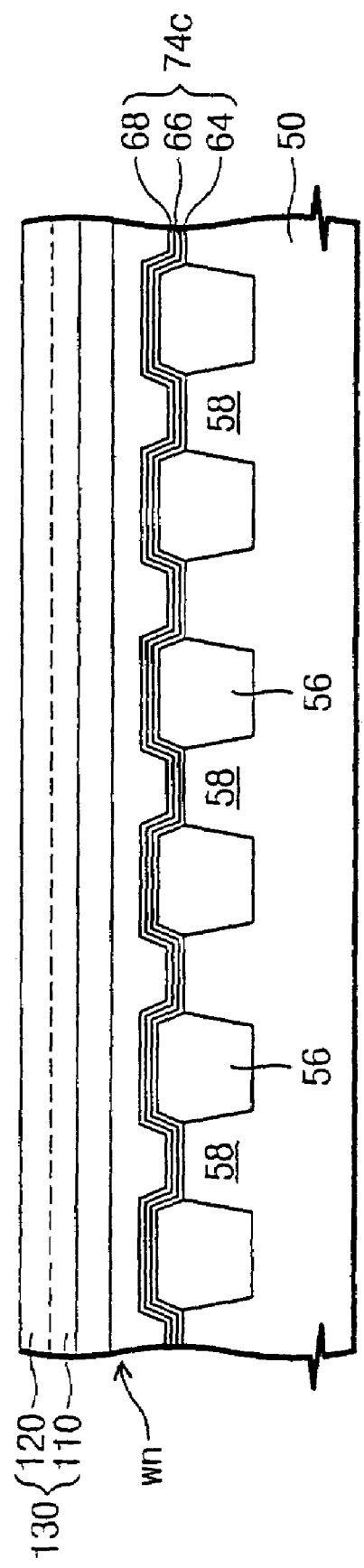

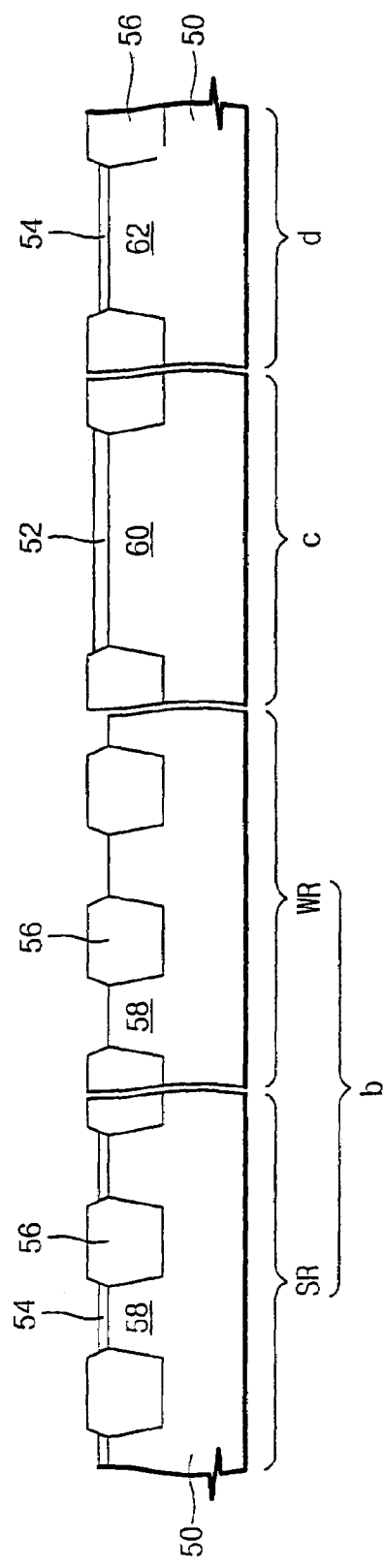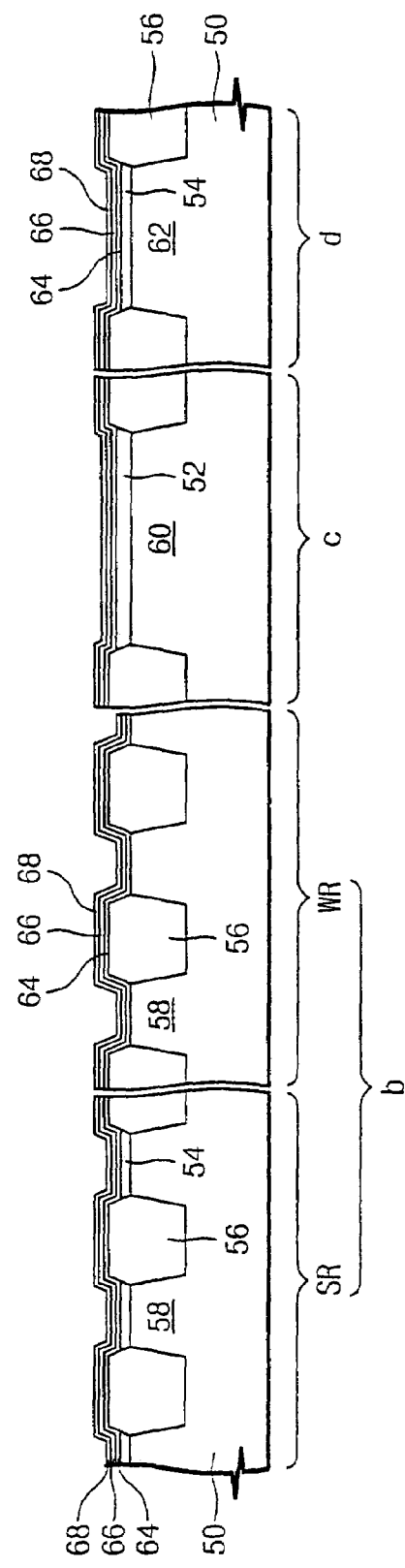

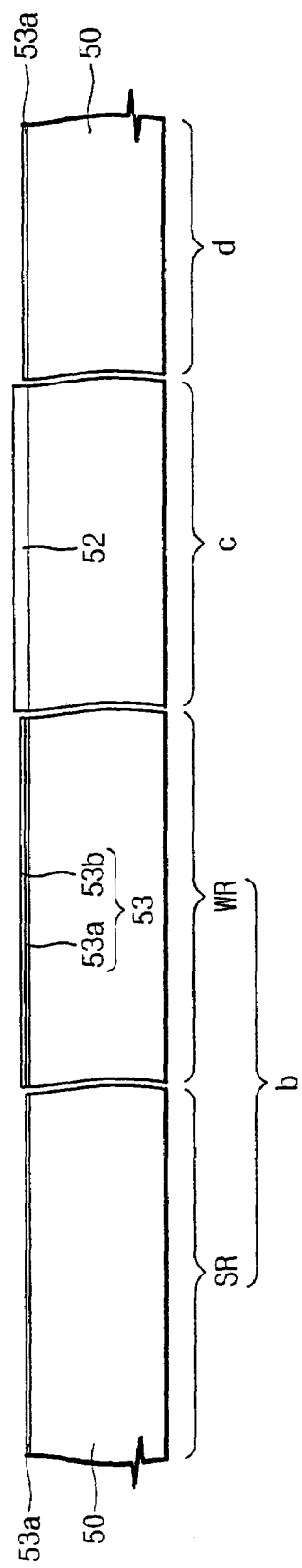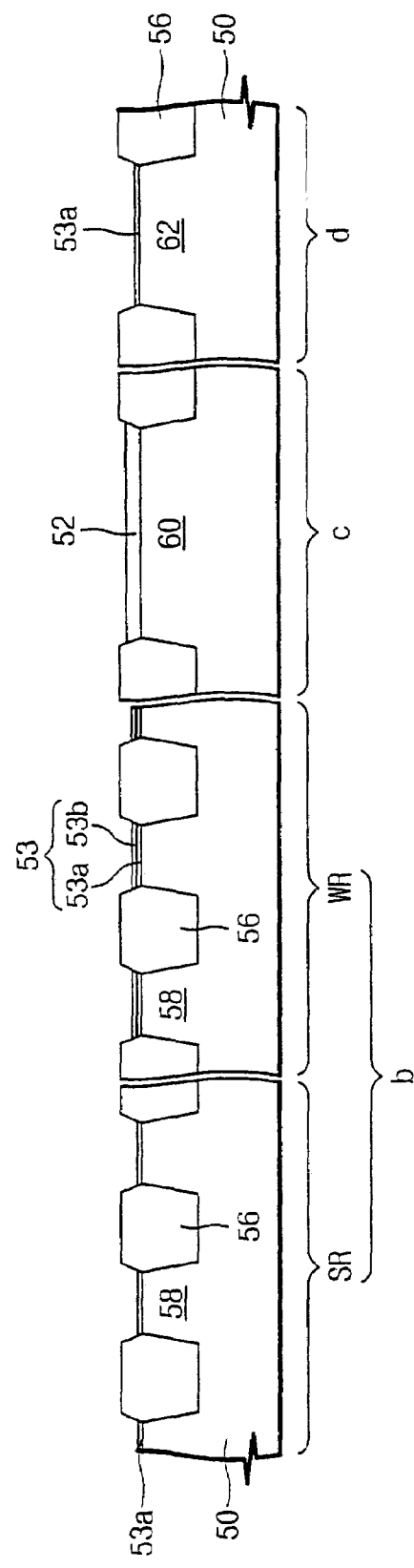

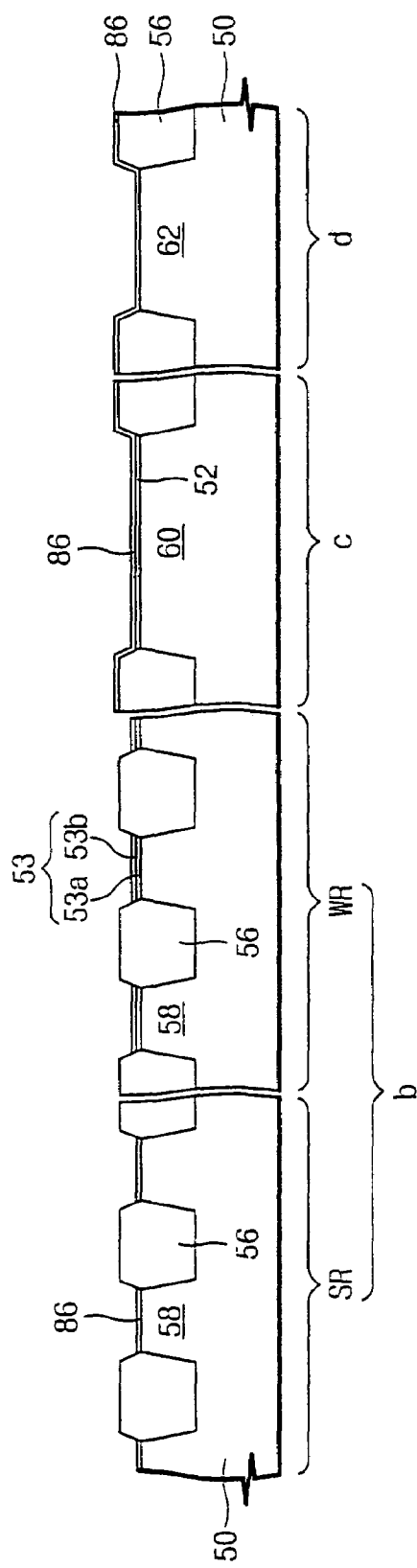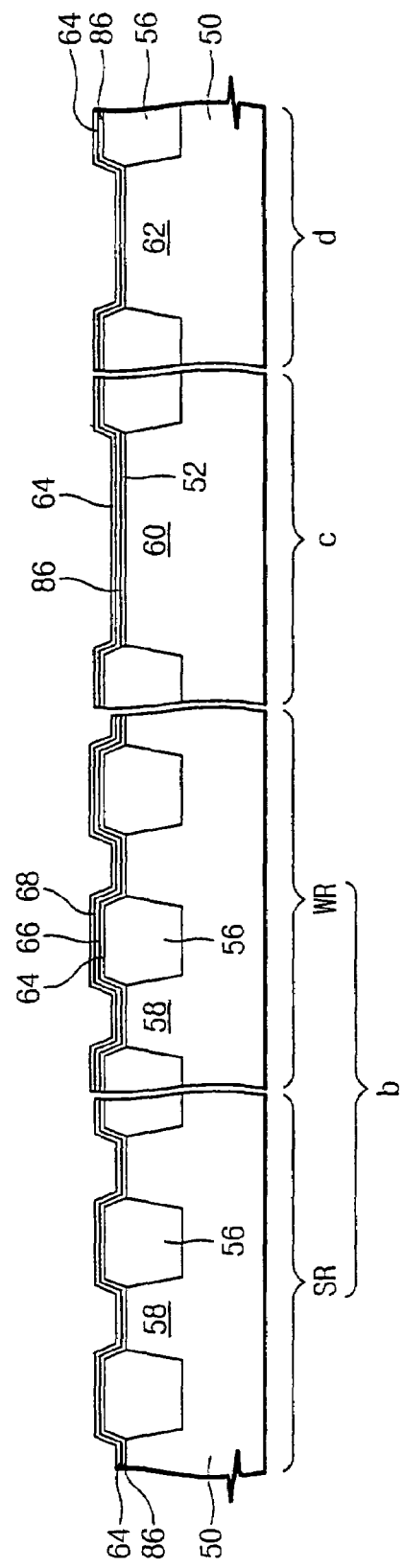

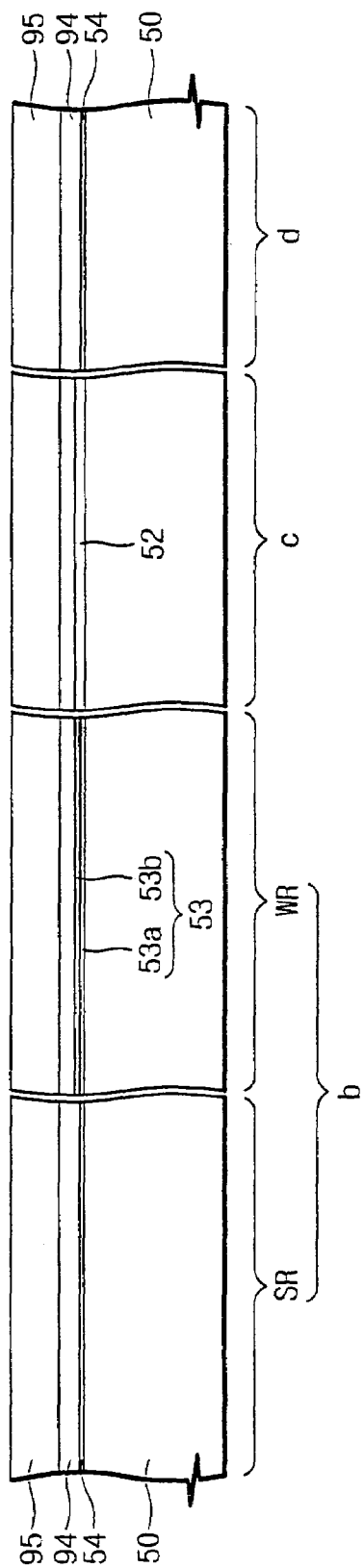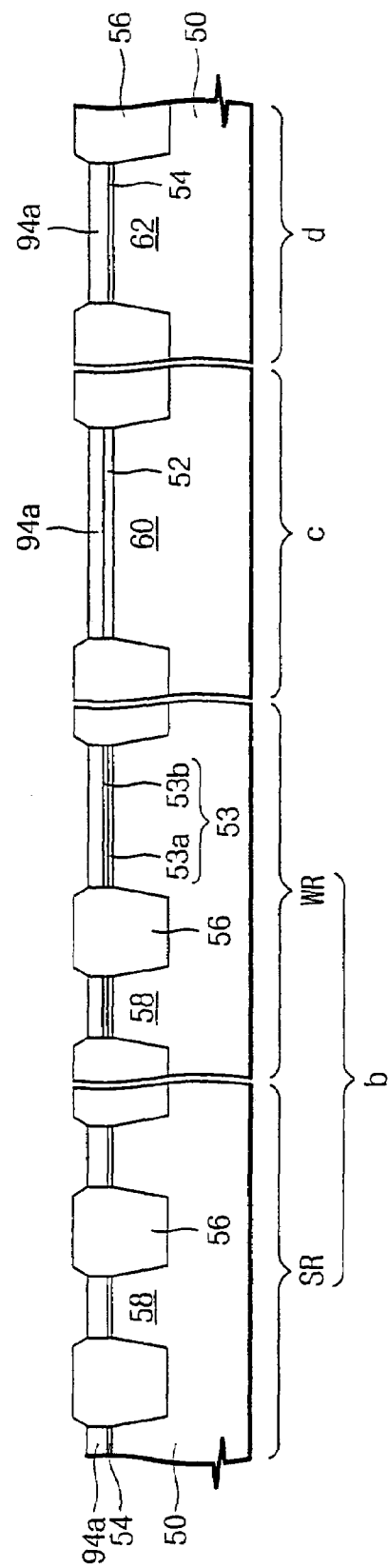

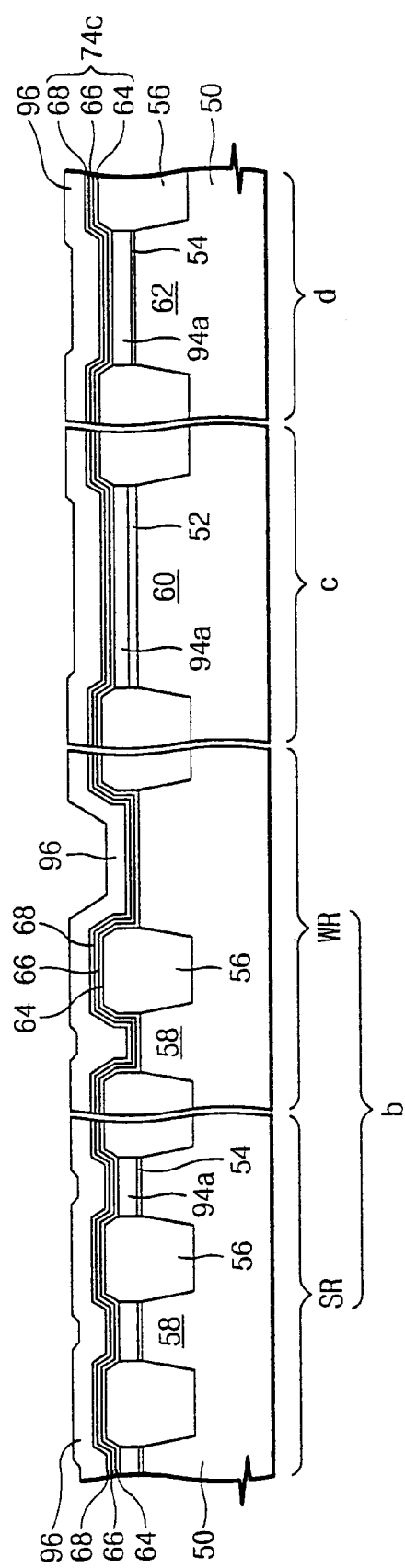

NON-VOLATILE MEMORY DEVICES WITH CHARGE STORAGE INSULATORS

RELATED APPLICATION

This application claims priority from Korean Patent Application No. 2003-01566 filed Jan. 10, 2003, in the Korean Intellectual Property Office, the disclosure of which is incorporated herein in its entirety by reference.

FIELD OF THE INVENTION

The present invention relates to memory devices and more specifically to non-volatile memory devices and methods for fabricating such devices.

BACKGROUND OF THE INVENTION

Non-volatile memory devices are memory devices that can store data when the power is cut off. Known types of non-volatile memory devices include flash memory devices, ferroelectric memory devices, phase changeable memory devices and magnetic memory devices.

Flash memory non-volatile memory devices include unit memory cells that have a structure similar to the structure of a MOS transistor. These devices do not require a separate data storage element and, as such, the cell region may be highly integrated. Generally speaking, a flash memory device may have one of two representative structures. The first such structure stores charge in a conductive floating gate, while the second representative structure stores the charge in a charge storage insulator. The flash memory devices that have the structure in which the charge is stored in a charge storage insulator may provide certain advantages, such as low program and erase voltages and excellent endurance and retention. In addition, multi-bit programmable versions of these devices can be fabricated.

FIGS. 1 through 5 depict a conventional flash memory non-volatile memory device that uses a charge storage insulator. As shown in the top plane view of the device provided in FIG. 1, the device includes a plurality of device isolation layers 28a that are formed on predetermined regions of a substrate 10 (the substrate is not shown in FIG. 1). An active region is defined between these device isolation layers 28a. A gate electrode 30 is disposed over the active region and the device isolation layers 28a. A charge trapping layer 16 is interposed between the gate electrode 30 and the active region.

FIGS. 2 through 5 are cross-sectional views taken along the line A—A of FIG. 1 illustrating various steps during the fabrication of the conventional non-volatile memory device depicted in FIG. 1. The conventional non-volatile memory device can be fabricated by forming a lower insulation layer 14, a charge trapping layer 16 and an upper insulation layer 18 on a substrate 10. A first conductive layer 20 and a hard mask layer 22 are formed on the upper insulation layer 18. The hard mask layer 22 and the first conductive layer 20 are patterned. Then, the upper insulation layer 18, the charge trapping layer 16, the lower insulation layer 14 and the substrate 10 are patterned to form the trench regions 12 that are depicted in FIG. 2.

A thermal process is then applied to the substrate 10 with the trench regions 12 to from a trench oxide layer 24 on the inner sides of the trench regions 12 (see FIG. 3). Then, an insulation layer 28 is formed on the trench oxide layer 24 to fill the trench regions 12. Generally, the substrate 10 and the first conductive layer 20 are formed of silicon. As a result, both the portion of the substrate 10 that contacts the lower insulation layer 14 and the portion of the first conductive layer 20 that contacts the upper insulation layer 18 may be partially etched (see reference numeral 26 on FIG. 3). Moreover, when silicon is thermally oxidized it expands such that it approximately doubles in volume. The tensile stress and compressive stress that results from the oxidation of the silicon substrate 10 and the first conductive silicon layer 20 may act to deteriorate the charge trapping layer 16. In addition, etch damage may occur during the formation of the trench regions 12 that leaves defects at one or both edges of the charge trapping layer 16 where the charge trapping layer 16 is aligned to the sidewalls of the trench regions 12.

As shown in FIG. 4, a chemical-mechanical polishing process may then be applied to the insulation layer 28. The insulation layer 28 is first polished until the hard mask layer 22 is exposed and the insulation layer 28 is divided into device isolation layers 28a that fill the trench regions 12. Then, the hard mask layer 22 is removed to expose the first conductive layer 20.

As shown in FIG. 5, a polysilicon layer 30 and a silicide layer 32 are then formed over the entire surface of the substrate. The polysilicon layer 30, the silicide layer 32 and the first conductive layer 20 are patterned to form a gate electrode 34 that crosses over the device isolation layers 28a. As discussed above, the conventional non-volatile memory device illustrated in FIG. 5 can have defects at the regions neighboring the device isolation layers 28a. These defects can deteriorate the data storage and endurance characteristics of the device.

SUMMARY OF THE INVENTION

Pursuant to embodiments of the present invention, non-volatile memory devices are provided that comprise a substrate on which a plurality of isolation layers are formed that define a plurality of active regions. These devices further include a charge storage insulator that is formed on the plurality of active regions and the plurality of isolation layers, as well as a plurality of word lines that formed on the charge storage insulator and that cross over the active regions. A plurality of conductive patterns may be disposed between the word lines that penetrate the charge storage insulator to electrically connect with the active region.

The charge storage insulator may comprise a lower oxide layer, a charge trapping layer and an upper oxide layer. The upper oxide layer may be an insulative metal oxide layer. The plurality of isolation layers and the plurality of active regions may be located in a cell region of the device, and the charge storage insulator may be formed on substantially the entire surface of the cell region.

In additional embodiments of the present invention, the plurality of trench isolation layers formed in the substrate may also define a plurality of second active regions in a high voltage region of the device and a plurality of third active regions in a low voltage region of the device. A high voltage gate pattern crosses over the second active region and a low voltage gate pattern crosses over the third active region. An insulation layer may also be interposed between the high voltage gate pattern electrode and the second active region, and an insulation layer may be interposed between the low voltage gate pattern and the third active region. These insulation layers may comprise single layer, double layer and/or triple layer insulation layers. The top surface of the isolation layers may be disposed higher than the top surface of active regions.

The high voltage gate electrode and the low voltage gate electrode may comprise a lower gate pattern that is formed between a pair of isolation layers and an upper gate pattern. The upper gate pattern is formed on the lower gate pattern and overlaps a portion of the isolation layers.

Methods of fabricating non-volatile memory devices are also disclosed. In embodiments of these methods, the device is fabricated by forming a plurality of trench isolation layers in the cell region of a substrate to define a plurality of active regions, and then forming a charge storage insulator on the active regions and the device isolation layers. A plurality of gate lines may then be formed on the charge storage insulator, and conductive patterns may also be formed that penetrate the charge storage insulator between some of the plurality of gate lines to electrically connect with the active region. The trenches in which the isolation layers are formed may be fabricated by forming a pad insulation layer and a hard mask on the substrate and then patterning the hard mask layer, the pad insulation layer and the substrate to form the trenches. Then an insulation layer may be formed over substantially the entire surface of the cell region, and this insulation layer may be polished down to the hard mask layer via polishing so as to divide the insulation layer into a plurality of trench isolation layers.

BRIEF DESCRIPTION OF THE DRAWINGS

FIG. 8 is a cross-sectional view, taken along the line C—C, of the non-volatile memory device depicted in FIG. 6.

FIGS. 13 through 20 are cross-sectional views illustrating steps of fabricating non-volatile memory devices according to embodiments of the present invention.

FIGS. 27 through 32 are cross-sectional views illustrating steps of fabricating non-volatile memory devices according to further embodiments of the present invention.

FIGS. 37 through 41 are cross-sectional views illustrating steps of fabricating non-volatile memory devices according to still further embodiments of the present invention.

DETAILED DESCRIPTION

Figure 1:
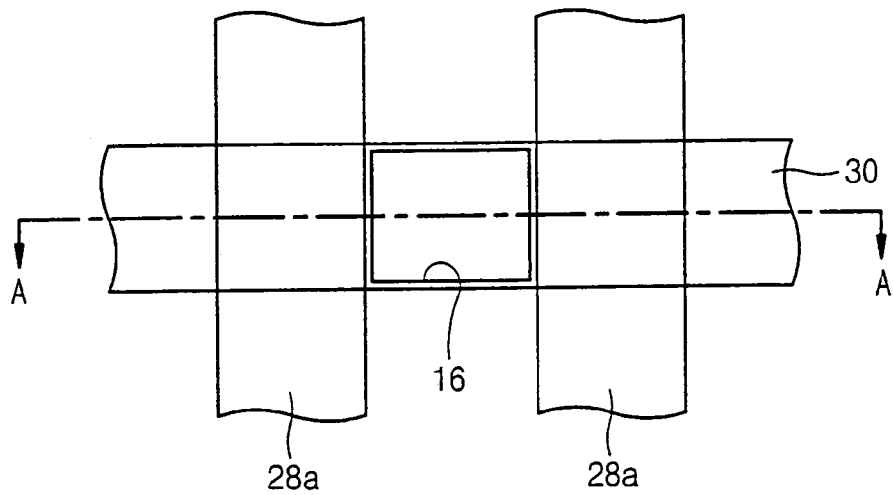
FIG. 1 is a top plane view of a non-volatile memory device that includes a conventional charge storage insulator.
Figure 2:
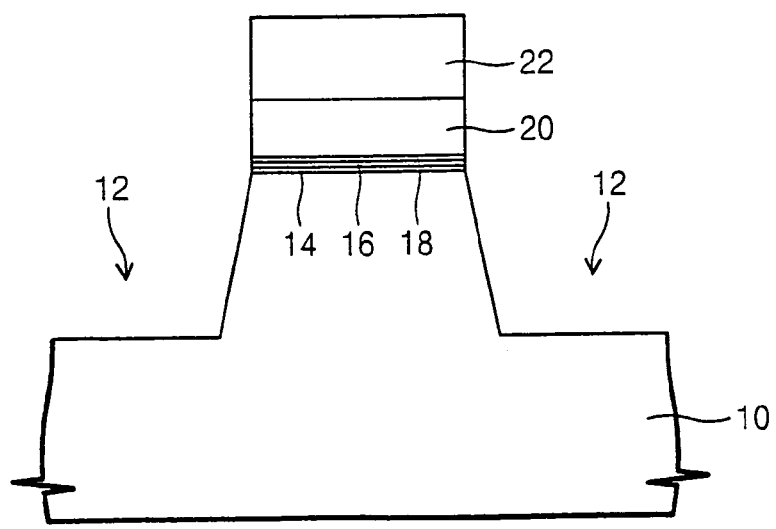
FIGS. 2 through 5 are process cross-sectional views taken along a ling A—A of FIG. 1 that illustrate a method of manufacturing a conventional non-volatile memory device depicted in FIG. 1.
Figure 3:
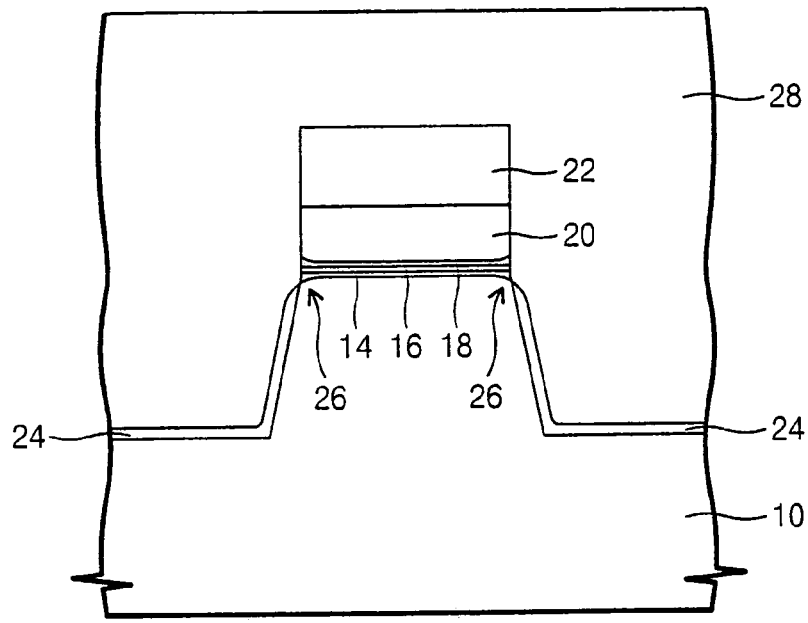
Figure 4:
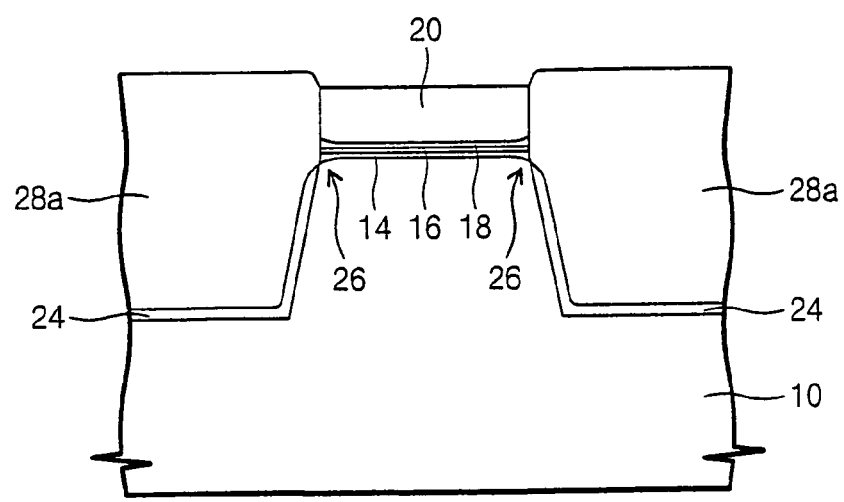
Figure 5:
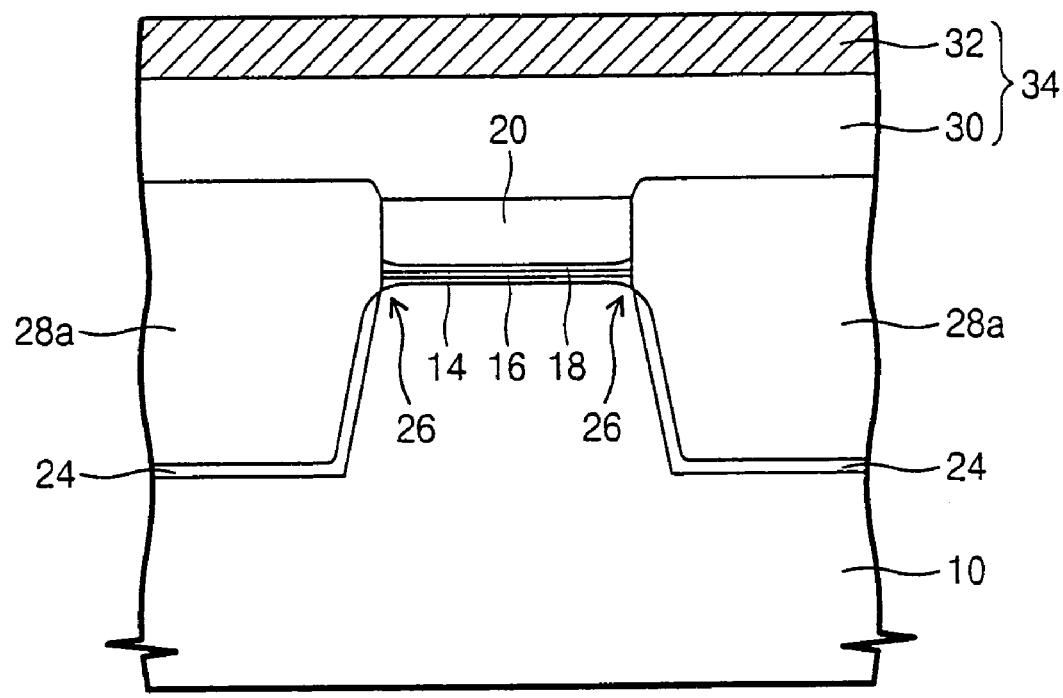

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when a layer is referred to as being "directly on" another layer, there are no intervening layers present. Like reference numerals refer to like elements throughout this application.

Figure 6:
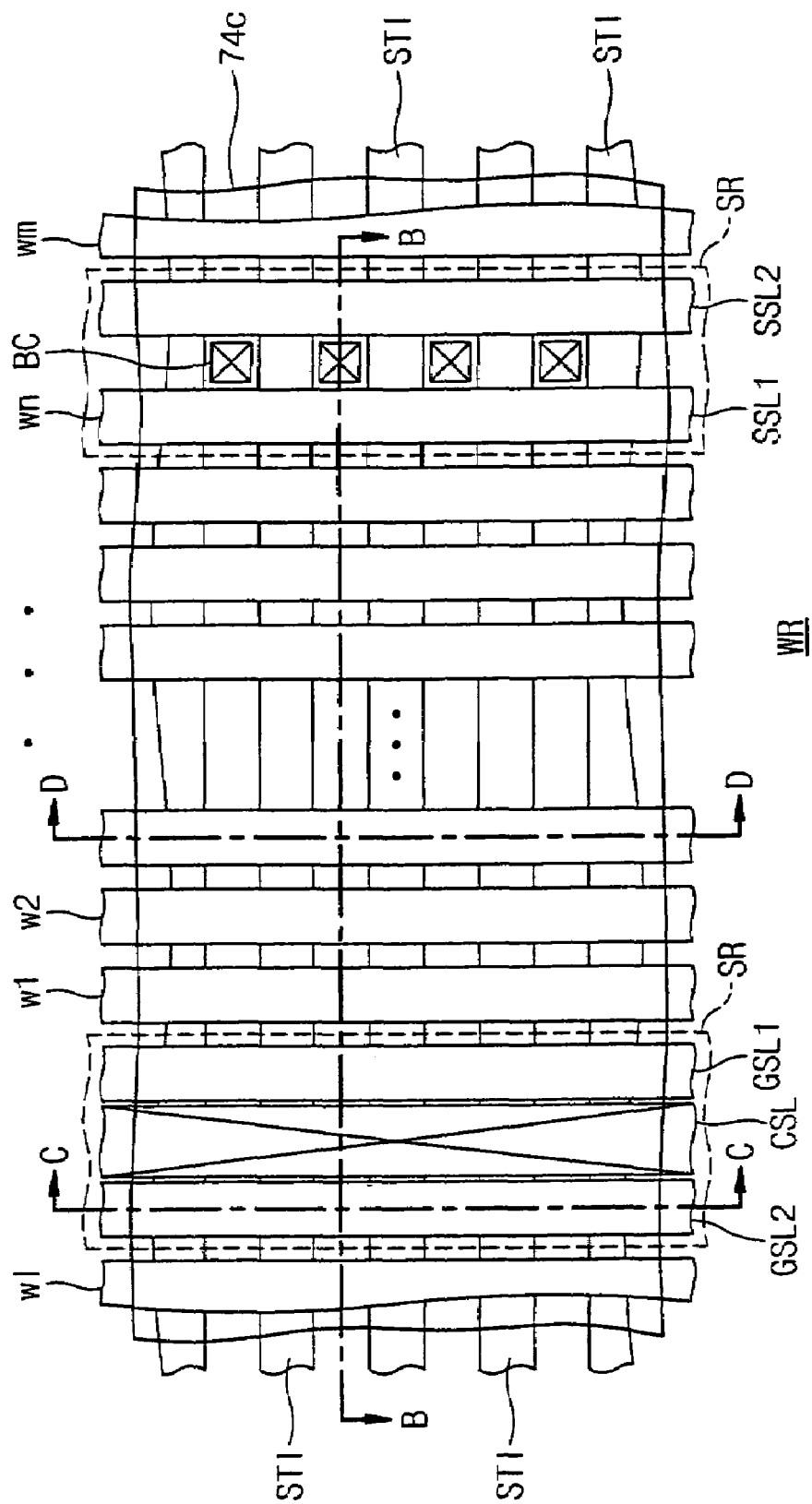
FIG. 6 is top plane view showing a cell region of non-volatile memory devices in accordance with embodiments of the present invention.

FIG. 6 is a top plane view illustrating the cell region of non-volatile memory devices according to embodiments of the present invention. As shown in FIG. 6, the cell region of the non-volatile memory device has selection gate regions SR and a word line region WR. The selection gate regions SR are disposed on a substrate and the word line regions WR are defined between the selection gate regions SR. Device isolation layers STI are formed on the substrate, and a charge store layer 74c covers the entire surface of the cell region. As shown in FIG. 6, the charge storage layer 74c may be conformally formed both on the active regions and on the device isolation layers STI that neighbor the active regions.

As is further illustrated in FIG. 6, a plurality of parallel gate lines GSL, SSL, w1~wn may be disposed on the charge storage layer 74c. The gate lines cross over the device isolation layers STI. The gate lines may comprise a plurality of word lines w1~wn, ground selection lines GSL and string selection lines SSL. The plurality of word lines w1~wn are disposed in the word line region WR, and the ground selection lines GSL and string selection lines SSL are disposed in the selection gate regions SR. A selection gate region SR may be provided on both sides of the word line region WR. In a NAND type cell array, the two ground selection lines GSL are formed opposite to each other and a common source line CSL is disposed between the ground selection lines GSL. In a NAND type cell array the two string selection lines SSL are disposed opposite to each other and a plurality of bit line plugs BC are disposed between the string selection lines SSL. The common source line CSL is disposed parallel to the word lines wn and is electrically connected to the active regions that are provided between the device isolation layers STI. The bit line plugs BC are also disposed parallel to the word lines wn and are also electrically connected to the active regions that are provided between the device isolation layers STI. Thus, as illustrated in FIG. 6, the charge storage insulation layer 74c may cover substantially the entire surface of the cell region (although, as noted above, the charge storage insulation layer 74c may have openings that expose the device isolation layer STI and the active region in the vicinity of the common source line CSL and the bit line plugs BC). Alternately, the charge storage insulator 74c may be formed only under the gate lines so that it does not cover the entire surface of the cell region.

Figure 7A:
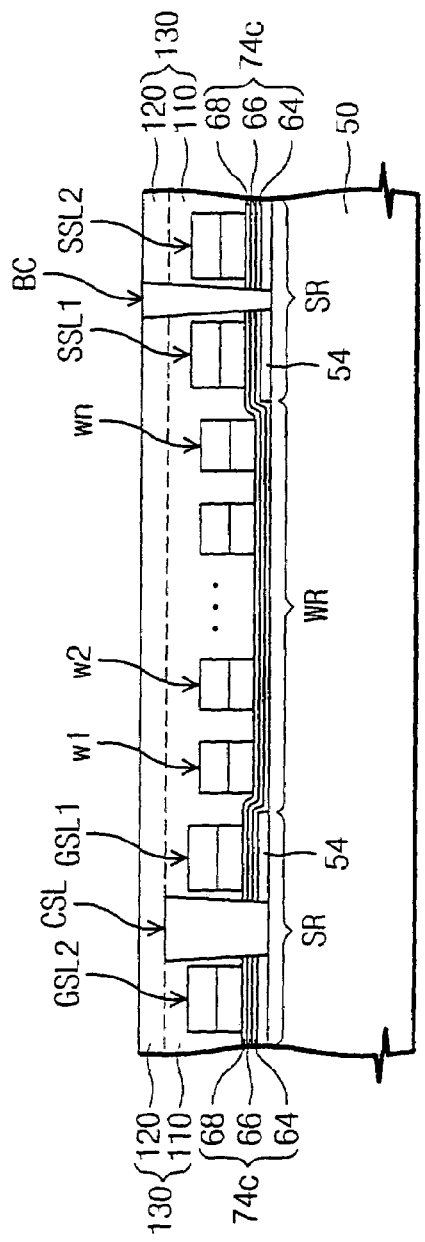
FIG. 7A is a cross-sectional view, taken along the line B—B, of certain of the embodiments of the non-volatile memory devices depicted in FIG. 6.

FIG. 7A is a cross-sectional view, taken along a line B—B, of the non-volatile memory device depicted in FIG. 6. FIG. 8 is a cross-sectional view, taken along the line D—D, of the non-volatile memory device depicted in FIG. 6. As shown best in FIG. 8, the cell region of the non-volatile memory device may include a plurality of parallel device isolation layers 56 that are formed in trenches provided in the substrate 50. The device isolation layers 56 define a plurality of active regions 58. Turning to FIG. 7A it is seen that the cell region comprises a word line region WR where word lines w1~wn are disposed and selection gate regions SR where selection gate lines SSLn and GSLn are disposed. A charge storage insulator 74c is formed on the substrate over the device isolation layers 56 and the active regions 58. The charge storage insulator 74c comprises a lower oxide layer 64, a charge trapping layer 66 and an upper oxide layer 68. The gate lines referenced above may be formed on the charge storage insulator 74c.

In a NAND type cell array, the gate insulation layer of the selection transistor may be thicker than that of the memory cell in order to reduce the possibility that the selection transistors are softly programmed. Thus, the memory device of the present invention may further include an oxide layer 54 that is interposed between the substrate 50 and the charge storage insulator 74c.

Figure 7B:
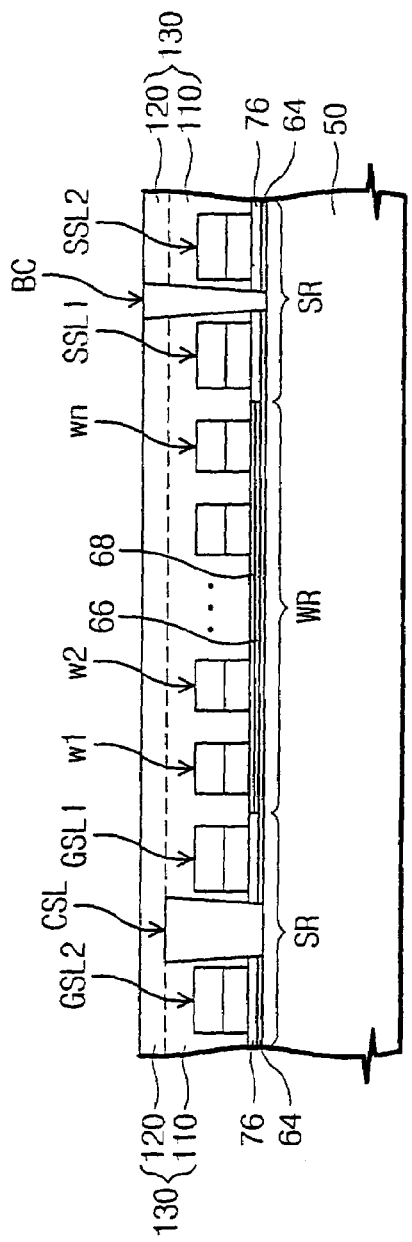
FIG. 7B is a cross-sectional view, taken along the line B—B, showing other embodiments of the non-volatile memory devices depicted in FIG. 6.

FIG. 7B depicts an alternative embodiment of the non-volatile memory devices of the present invention. As shown in FIG. 7B, in this alternative structure the charge trap layer 66 and the upper oxide layer 68 may be formed only in the word line region WR. In contrast to the device depicted in FIG. 7A, in the selection gate region the device of FIG. 7B may omit both the charge trap layer 66 and the upper oxide layer 68. As is also shown in FIG. 7B, an oxide layer 76 may be formed on the lower oxide layer 64.

As is best seen in FIG. 8, the top surface of the device isolation layers 56 may be formed so that they are higher than the top surface of the active regions. According to additional aspects of the present invention, the sidewalls of the device isolation layers 56 adjacent the active regions may have a predetermined angle of inclination or curvature.

As best seen in FIGS. 7A and 7B, the gate lines may comprise ground selection lines GSL and string selection lines SSL and a plurality of word lines w1~wn. The gate lines cross over the device isolation layers 56 and may be disposed so they are parallel to each other. The ground selection lines GSL and the string selection lines SSL are located in the selection gate regions SR, and the word lines w1~wn are located in the word line region WR. Additionally, a conductive pattern is disposed between the ground selection lines GSL1 and GSL2 that is parallel to the word lines w1~wn. This conductive pattern corresponds to a common source line CSL. A plurality of conductive patterns may also be disposed between the string selection lines SSL1 and SSL2, and these conductive patterns may correspond to a bit line plug BC.

As shown best in FIGS. 7A and 7B, the common source line CSL is formed in an interlayer dielectric layer 130. As shown in FIG. 7A, the common source line CSL extends through charge storage insulator 74c and the oxide layer 54 to electrically connect to the active regions 58. Alternatively, as shown in FIG. 7B, the common source line CSL extends through lower oxide layer 64 and oxide layer 76 to electrically connect to the active regions 58. The common source line CSL may be formed as follows. A first interlayer insulation layer 110 can be formed. Then, the first interlayer insulation layer 110, the charge storage insulator 74c and the oxide layer 54 can be patterned to form a groove. Alternatively, the interlayer insulation layer 110, the lower oxide layer 64 and the oxide layer 76 can be patterned to form a groove. The groove can then be filled with a conductive layer to form the common source line CSL.

The bit line plugs BC are likewise formed in the interlayer dielectric layer 130. As shown in FIG. 7A, the bit line plugs BC extend through the charge storage insulator 74c and the oxide layer 54 to electrically connect to the active regions 58. Alternatively, as shown in FIG. 7B, the bit line plugs BC extend through lower oxide layer 64 and oxide layer 76 to electrically connect to the active regions 58. These bit line plugs BC can be formed in the following steps. When the first interlayer insulation layer 110 is formed as described above, the layer 110 covers the area where the bit line plugs will be disposed. Then, a second interlayer insulation layer 120 is formed on the first interlayer insulation layer 110. The first and second interlayer insulation layers 110 and 120 and the charge storage insulator 74c may then be patterned to form a plurality of contact holes (see FIGS. 7A and 6). Alternatively, the first and second interlayer insulation layers 110 and 120, the lower oxide layer 64 and the oxide layer 76 may then be patterned to form a plurality of contact holes (see FIGS. 7B and 6). The contact holes expose the active region. These contact holes may then be filled with conductive material to form the bit line plugs BC. Note that the upper oxide layer 68 that is part of the charge store insulation layer 74c may be an insulation metal oxide such as, for example, aluminum oxide. Such an insulation metal oxide may be selectively etched with respect to silicon oxide so that the insulation metal oxide may be used as an etch stop layer during etching of the first interlayer dielectric layer in order to form the groove (that is used to form the common source line CSL) or the contact holes (that are use to form the bit line plugs BC).

Figure 9:
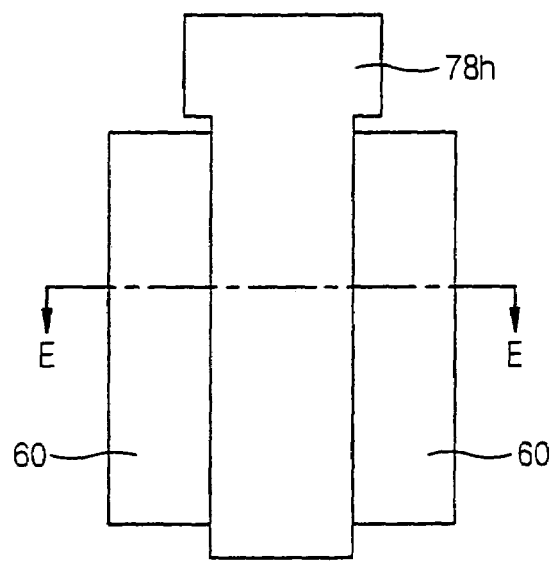
FIG. 9 is a top plane view of the high voltage region of a nonvolatile memory devices in accordance with embodiments of the present invention.
Figure 10:
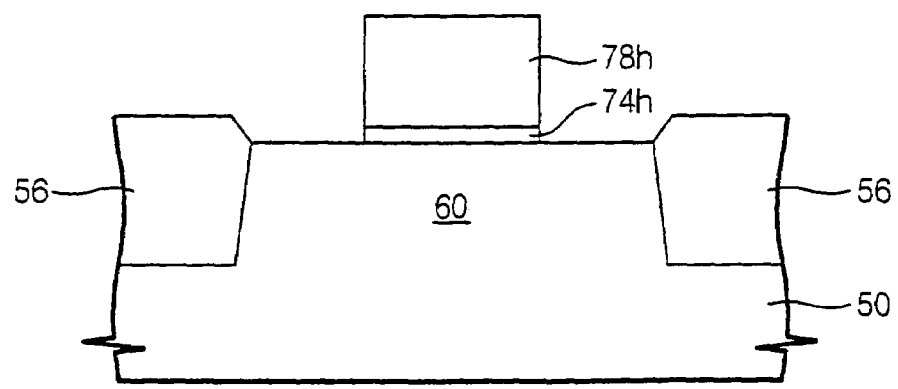
FIG. 10 is a cross-sectional view taken along the line E—E of a high voltage region of the non-volatile memory devices depicted in FIG. 9.

FIGS. 9 through 12 depict high and low voltage regions of non-volatile memory devices according to embodiments of the present invention. FIG. 9 is a top plane view of a high voltage transistor (operating at high voltage) that is disposed in the high voltage region of the device. FIG. 10 is a cross-sectional view, taken along a line E—E of the device of FIG. 9. As shown in FIGS. 9 and 10, in the high voltage region a pair of device isolation layers 56 define an active region 60. A high voltage gate electrode 78h is disposed on the active region 60. Additionally, a high voltage gate insulation layer 74h may be interposed between the high voltage gate electrode 78h and the active region 60 (see FIG. 10). This high voltage insulation layer 74h may comprise one or more layers.

Figure 11:
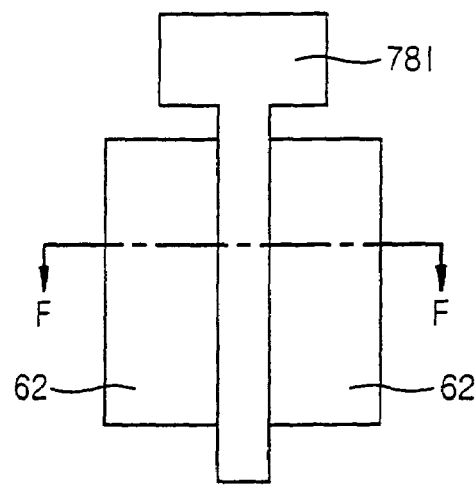
FIG. 11 is a top plane view of a low voltage region of nonvolatile memory devices in accordance with embodiments of the present invention.
Figure 12:
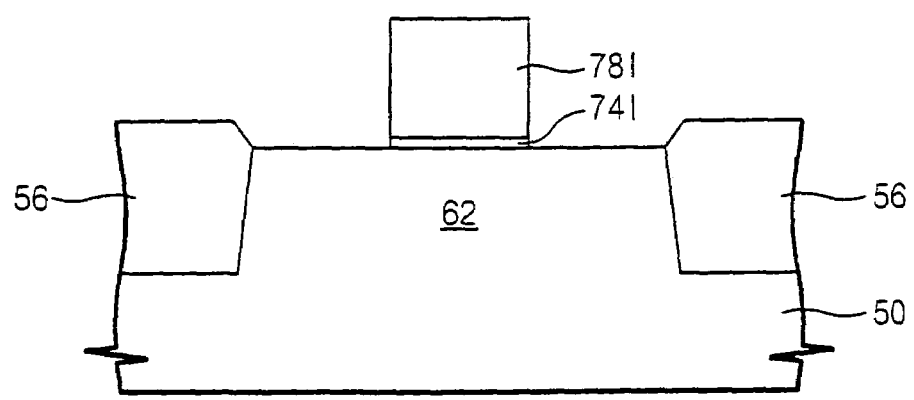
FIG. 12 is a cross-sectional view taken along the line F—F of the low voltage region of the non-volatile memory devices depicted in FIG. 11.

FIG. 11 is a top plane view of a low voltage transistor (that has a low operating voltage) that is disposed in the low voltage region of the device. FIG. 12 is a cross-sectional view, taken along a line F—F of the device of FIG. 11. As shown in FIGS. 11 and 12, a pair of device isolation layers 56 define an active region 62. A low voltage gate electrode 78l is disposed on the active region. Additionally, a low voltage gate insulation layer 74l may be interposed between the low voltage gate electrode 78l and the active region 62 (see FIG. 12). The low voltage gate insulation layer 74l may include one or more layers and might be, for example, a double layer.

FIGS. 13 through 41 are cross-sectional views illustrating non-volatile memory devices according to embodiments of the present invention and methods for fabricating these devices. In these figures, "b" refers to the cell region of the device, "c" refers to the high voltage region of the device taken along the line E—E of FIG. 9 and "d" refers to the low voltage region of the device taken along the line F—F of FIG. 11. The portion of these figures designated SR shows a cross-section of the device taken along the line C—C of FIG. 6. The portion designated WR shows a cross-section taken along the line D—D of FIG. 6.

Figure 13:
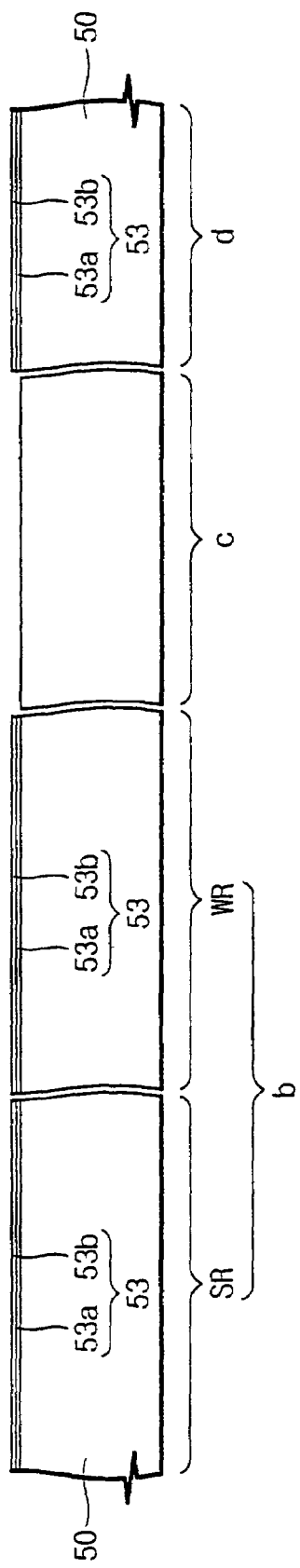
Figure 14:
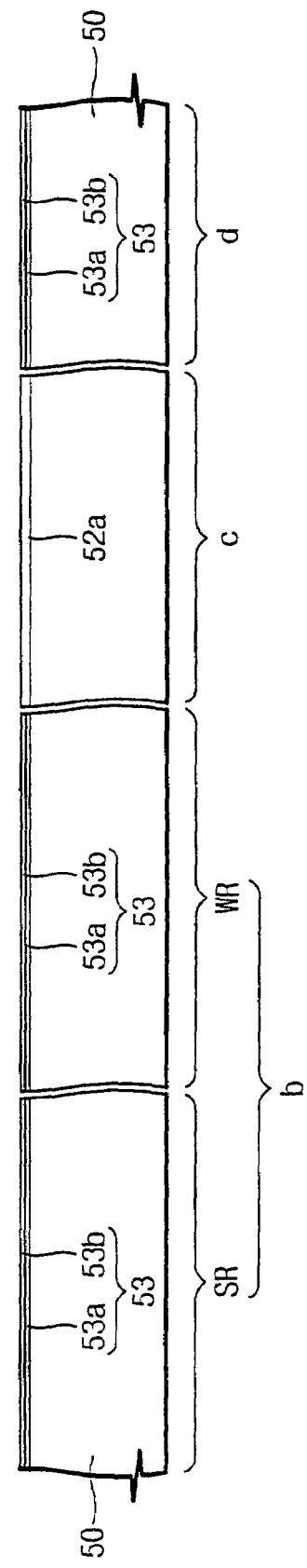

FIGS. 13 through 20 are cross-sectional views showing non-volatile memory devices and methods of fabricating the same in accordance with first embodiments of the present invention. As shown in FIG. 13, a two layer pad insulation layer 53 comprising a pad oxide layer 53a and a pad nitride layer 53b is sequentially formed on a substrate 50 in the cell region "b", the high voltage region "c" and the low voltage region "d" of the device. The pad insulation layer 53 of high voltage region "c" is removed. As shown in FIG. 14, a first oxide layer 52a is formed on the substrate in the high voltage region "c" portion of the device. This may be accomplished by applying a thermal oxidation to the substrate 50.

Figure 15:
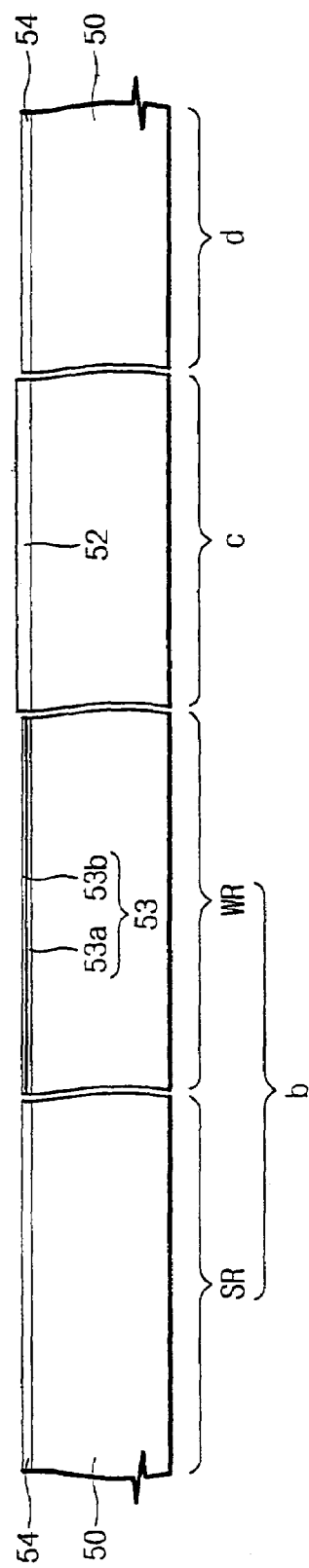

As shown in FIG. 15, next the pad insulation layer 53 that was formed in the low voltage region is removed. The pad insulation layer 53 that was formed on the selection gate region SR of the cell region "b" is also removed. This may be accomplished by selectively etching using a photolithographic process. As is also shown in FIG. 15, a second oxide layer 54 may be formed on the substrate in both the low voltage region "d" and the selection gate region SR of cell region "b" by applying a thermal oxidation to the substrate 50. The first oxide layer 52a that was formed in the high voltage region "c" may increase in thickness to become first oxide layer 52 due to the thermal oxidation process.

Figure 16:
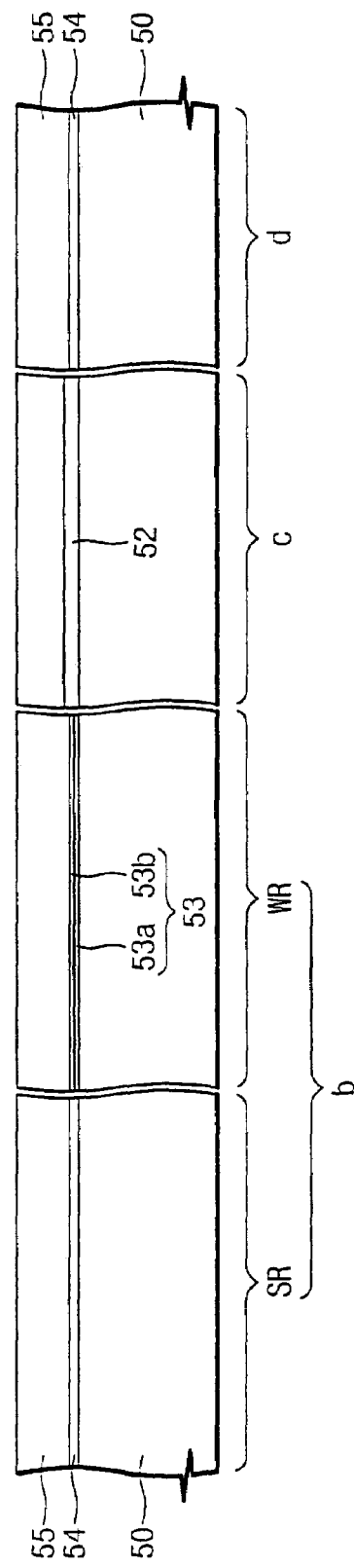

As shown in FIG. 16, a hard mask layer 55 may be formed over the entire surface of the substrate 50 (i.e., it is deposited on the pad insulation layer 53 in the word line region WR of cell region "b", on the first oxide layer 52 in the high voltage region "c" and on the second oxide layer 54 in the low voltage region "d" and in the selection gate region SR of cell region "b."

As shown in FIG. 17, a plurality of device isolation layers 56 may then be formed on the substrate 50. The device isolation layers 56 define first active regions 58 in the cell region "b", second active regions 60 in the high voltage region "c", and third active regions 62 in the low voltage region "d". As shown in FIG. 17, the device isolation layers 56 may have a trench structure. These device isolation layers 56 may be formed by successively patterning the hard mask layer 55, the pad insulation layer 53, the first oxide layer 52, the second oxide layer 54 and the substrate 50 to form a plurality of trenches in the substrate 50. An insulation layer is formed to fill in the trenches. Then, chemical mechanical polishing may be used to expose the hard mask layer 55. This chemical mechanical polishing simultaneously turns the insulation layer into a plurality of device isolation layers 56. As shown in FIG. 17, the top surface of the device isolation layers 56 are disposed higher than the top region of the active regions 58, 60, 62.

Thereafter, the hard mask layer 55 may be removed and a pad insulation layer 53 may be formed on the cell region "b". The hard mask layer 55 and the pad nitride layer 53b may be removed by a wet etch using phosphoric acid. The pad oxide layer 53a may be removed by a wet etch using diluted solution of hydrogen fluoride (HF) or buffered oxide etchant (BOE). As a result, the protruding portions of the device isolation layers 56 in the of the cell region may have inclined sidewalls and the edges of the protruded portions may have a predetermine curvature.

As shown in FIG. 18, a lower oxide layer 64, a charge trapping layer 66 and an upper oxide layer 68 may be formed on entire surface of the substrate. The lower oxide layer 64 may be formed of, for example, silicon oxide, silicon oxynitride or metallic oxide. The charge trapping layer 66 may be formed of silicon nitride or silicon oxynitride. In particular embodiments of the present invention, the charge trapping layer 66 may be formed of a material having etch selectivity with respect to the lower oxide layer. The upper oxide layer 68 may be formed of silicon oxide, silicon oxynitride or insulating metallic oxide such as, for example, an aluminum oxide layer.

Figure 19:
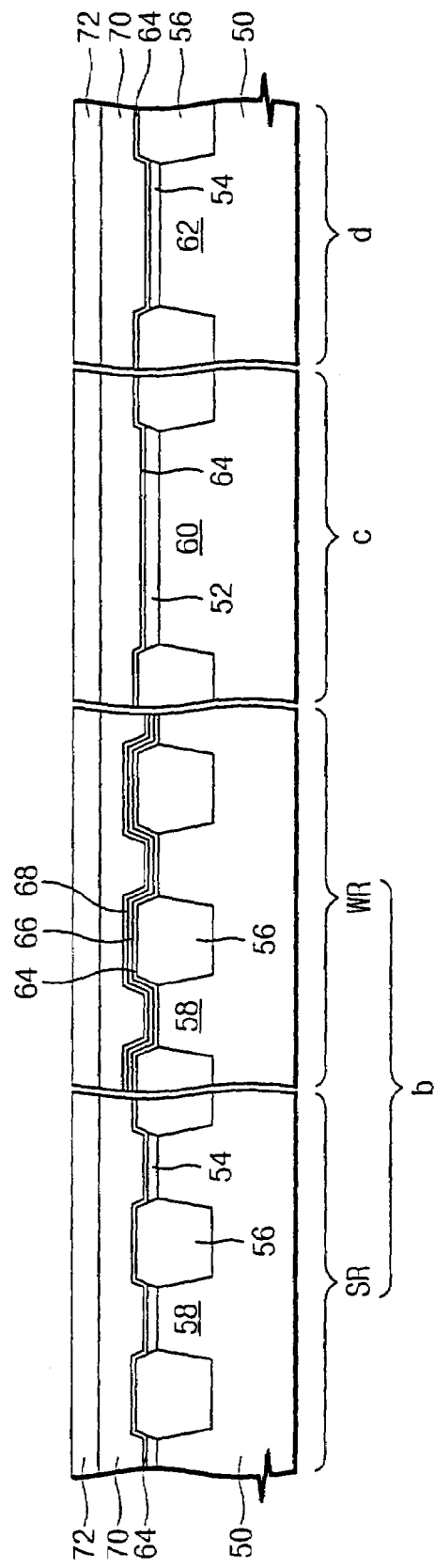

As shown in FIG. 19, the upper oxide layer 68 and the charge trapping layer 66 are removed in the selection gate region SR of cell region "b", the high voltage region "c" and the low voltage region "d". A conductive layer is then formed on the entire surface of the substrate 50. The conductive layer may be formed by first forming a polysilicon layer 70 and then forming a low resistance layer 72 on the substrate 50. The low resistance layer 72 may be formed of tungsten, tungsten silicide, titanium silicide or cobalt silicide.

Figure 20:
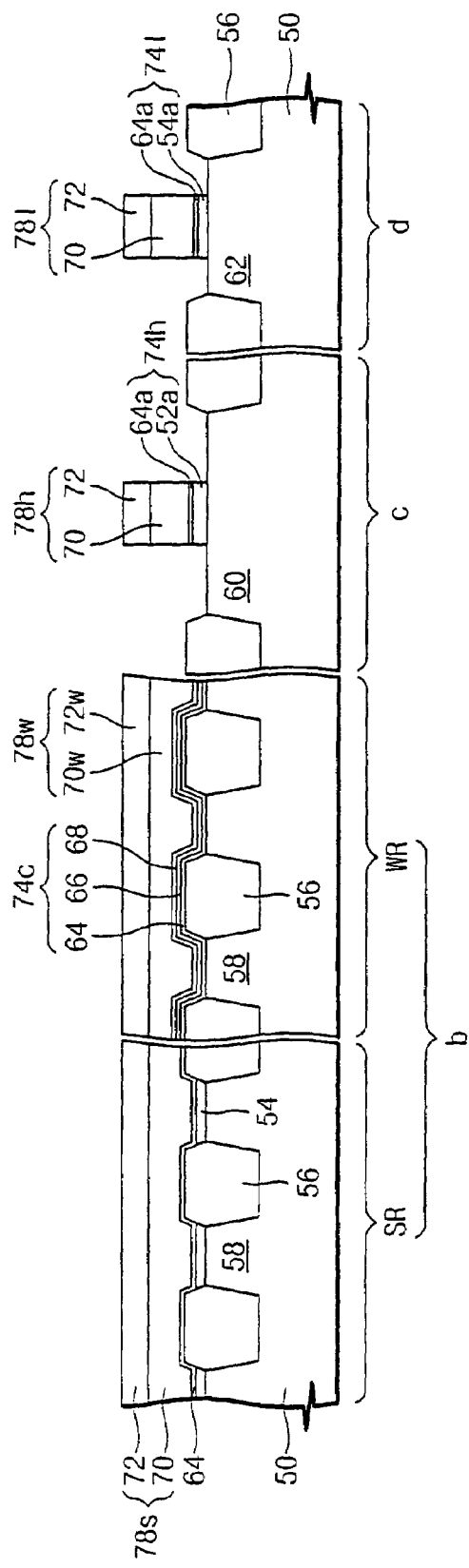

As shown in FIG. 20, the low resistance layer 72 and the polysilicon layer 70 are successively patterned to form word lines 78w in the word line region WR of the cell region "b" and selection gate lines 78s at the selection gate region SR of cell region "b". The word lines 78w and the selection gate lines 78s cross over the device isolation layers 56. Additionally, a high voltage gate electrode 78h is formed on the high voltage region "c" and a low voltage gate electrode 78l is formed on the low voltage region "d". The high voltage gate electrode 78h crosses over the second active region 60 and the low voltage gate electrode 78l crosses over the third active region 62. A charge storage insulator 74c that comprises a stacked lower oxide layer 64, a charge trapping layer 66 and an upper oxide layer 68 is interposed between the word lines 78w and the first active regions 58. The charge storage insulator 74c may be formed on an entire surface of the word line region WR or alternatively may be formed only under the word lines 78w.

As is also shown in FIG. 20, a second oxide layer 54 and a lower oxide layer 64 are interposed between the selection gate lines 78s and the first active regions 58. A high voltage gate insulation layer 74h is interposed between the high voltage gate electrode 78h and the second active region 60. As shown in FIG. 20, this high voltage gate insulation layer 74h may comprise a patterned first oxide layer 52a onto which a patterned lower oxide layer 64a is stacked. A low voltage gate insulation layer 74l is interposed between the low voltage gate electrode 78l and the third active region 62. This low voltage gate insulation layer 74l may comprise a patterned second oxide layer 52a onto which a patterned lower oxide layer 64a is stacked.

The charge trapping insulation layer 74c may cover the entire surface of the word line region WR (not shown in the drawings). As noted above, the charge trapping insulation layer 74c may comprise a stacked semiconductor structure comprising a lower oxide layer 64, a charge trapping layer 66 and an upper oxide layer 68. The high voltage gate insulation layer 74h may cover the second active region 60 on both sides of the high voltage gate electrode 78h. Similarly, the low voltage gate insulation layer 74l may cover the third active region 62 on both sides of the low voltage gate electrode 78l. This occurs because the insulation layers disposed under the high voltage gate electrode 78h and the low voltage gate electrode 78l are not removed during the etch process due to the etch selectivity of polysilicon and silicon oxide. The residual insulation layer may be removed in an over-etch process or in a cleaning process or it may be left in place.

An interlayer insulation layer may be formed on the substrate with the gate lines 78w, the high voltage gate electrode 78h and the low voltage gate electrode 78l. A line-shaped conductive pattern that corresponds to a common source line and a plurality of plug-type conductive patterns that correspond to a bit line plug are formed in the interlayer insulation layer parallel to the word lines 78w. Electrodes which are electrically connected to the second active region 60 and the third active region 62 may be formed simultaneously.

Figure 21:
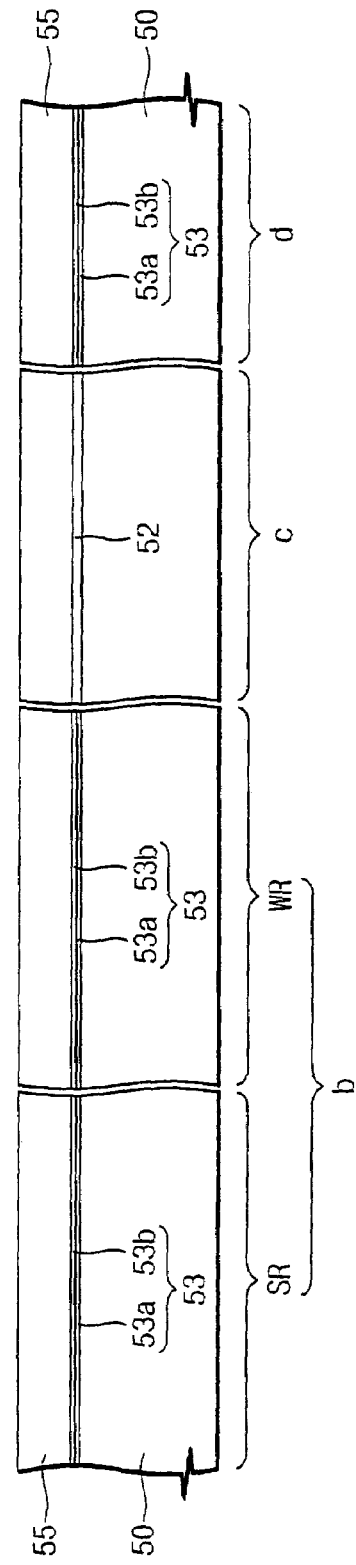
FIGS. 21 through 26 are cross-sectional views illustrating steps of fabricating non-volatile memory devices according to additional embodiments of the present invention.

FIGS. 21 through 26 are cross-sectional views showing a non-volatile memory devices and methods of fabricating the same in accordance with second embodiments of the present invention. As shown in FIG. 21, a pad insulation layer 53 is formed on the substrate 50 in both the cell region "b" and in the low voltage region "d". A first oxide layer 52 is also formed on the substrate 50 in the a high voltage region "c". The pad insulation layer 53 and the first oxide layer 52 may be formed in the manner discussed above with respect to the embodiment depicted in FIGS. 13 and 14. A hard mask layer 55 may then be formed on the entire surface of the substrate 50.

Figure 22:
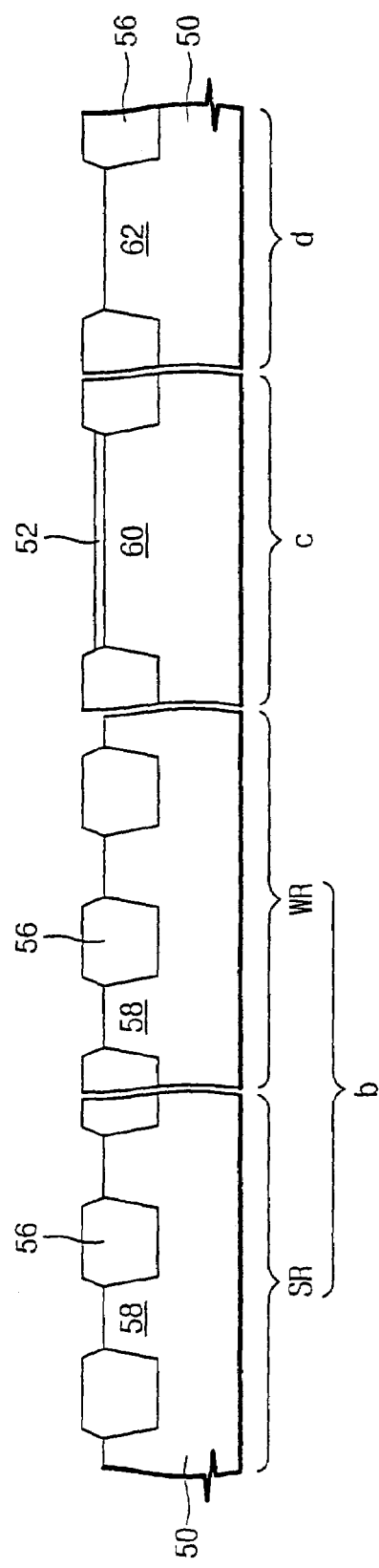

As shown in FIG. 22, a plurality of device isolation layers 56 are formed on the semiconductor substrate 50. The device isolation layer 56 may be formed using trench isolation technology and/or by the methods discussed above with respect to the first set of embodiments of the present invention. The device isolation layers 56 define a plurality of first active regions 58 in the cell region "b", a second active region 60 in the high voltage region "c" and a third active region 62 in the low voltage region "c". The hard mask layer 55 is then removed and the pad insulation layer 53 is removed from both the cell region "b" and the low voltage region "d".

Figure 23:
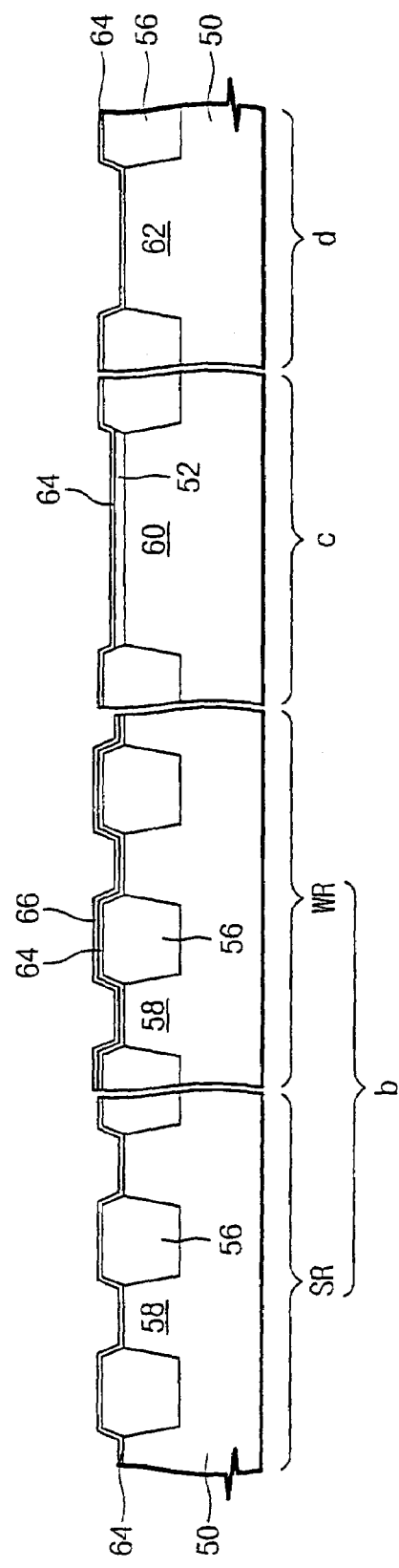

A lower oxide layer 64 and a charge-trapping layer 66 are formed over the entire surface of the substrate. As illustrated in FIG. 23, the charge trapping layer 66 may then be removed from the high voltage region "c", from the low voltage region "d" and the selection gate region SR of the cell region "b".

Figure 24:
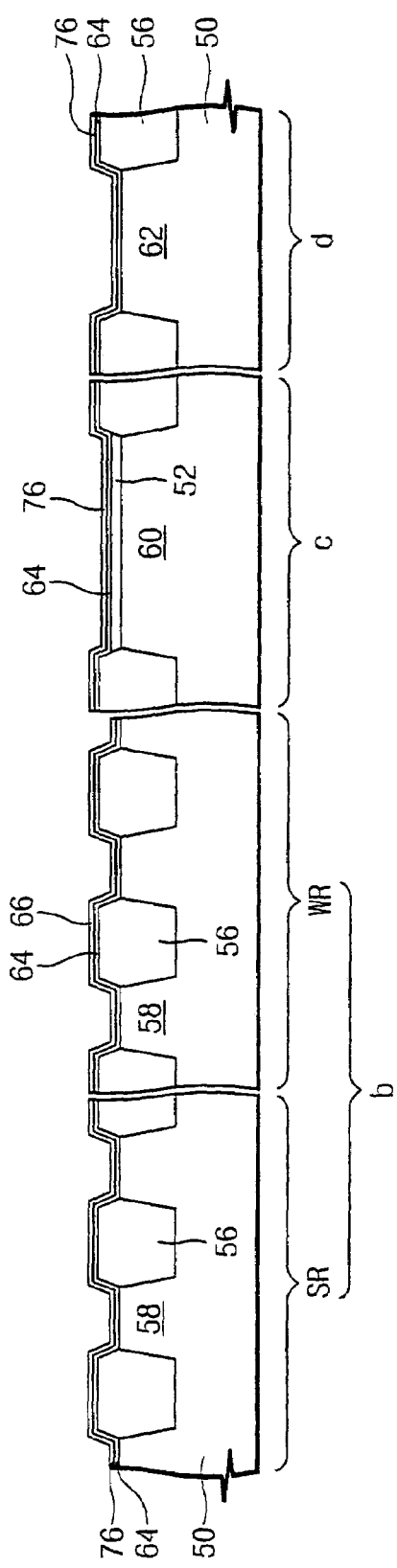

As shown in FIG. 24, a second oxide layer 76 may then be formed on the entire surface of the substrate. This second oxide layer 76 may then be removed from the cell region "b". The second oxide layer 76 may comprise, for example, a silicon oxide, a silicon oxynitride or an insulation metal oxide layer. The charge trapping layer 66 may be formed of silicon oxynitride. Such an embodiment allows the second oxide layer 76 of the cell region "b" to be removed using the charge trapping layer 66 as an etch stop layer. In another approach, the second oxide layer 76 may be formed using a thermal oxidation process. In this case, the second oxide layer 76 is not formed on the charge trapping layer 66 and therefore the step of removing the second oxide layer 76 is not required.

Figure 25:
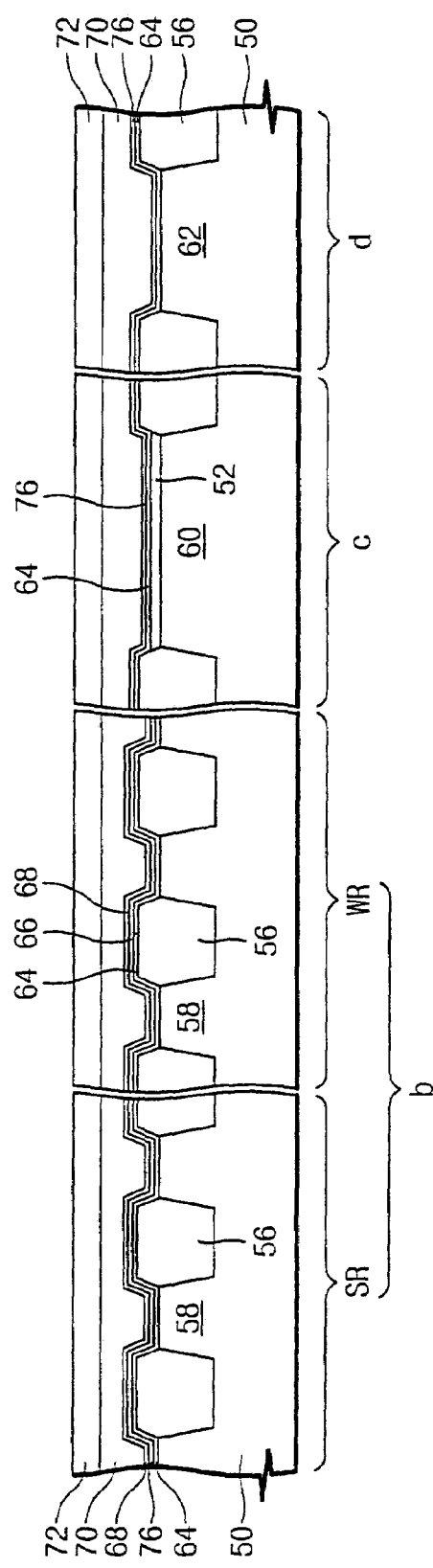

As illustrated in FIG. 25, next an upper oxide layer 68 may be formed on the entire surface of the substrate. The upper oxide layer 68 is then removed from the high voltage region "c" and the low voltage region "d". The upper oxide layer 68 may be formed of an insulation metal oxide such as, for example, aluminum oxide. Generally, an aluminum oxide layer is known to have etch selectivity with respect to a silicon oxide layer. As a result, the second oxide layer 76 that is disposed under the upper oxide layer 68 is not etched when the upper insulation layer 68 in the high voltage region "c" and the low voltage region "d" are removed via an etch process. As is also seen in FIG. 25, these processing steps leave a lower oxide layer 64, a charge trapping layer 66 and an upper oxide layer 68 stacked in the word line region WR of the cell region "b" while a lower oxide layer 64, a second oxide layer 76 and an upper oxide layer 68 are stacked on the selection gate region SR of the cell region "b". In the high voltage region "c" a first oxide layer 52, a lower oxide layer 64 and a second oxide layer 76 are stacked on the substrate 50 and in the low voltage region "d" a lower oxide layer 64 and a second oxide layer 76 are stacked on the substrate 50.

As is also shown in FIG. 25, a double layer conductive layer that comprises a polysilicon layer 70 and a low resistance layer 72 is formed over the entire surface of substrate. The low resistance layer 72 may be formed, for example, of tungsten, tungsten silicone, titanium silicide or cobalt silicide.

Figure 26:
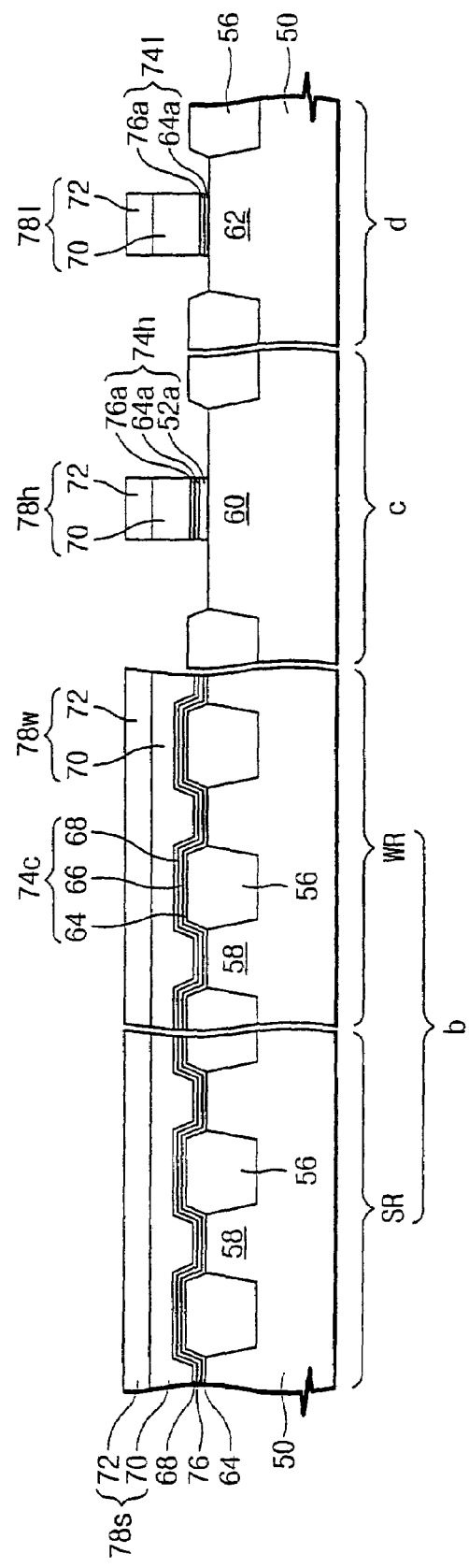

As shown in FIG. 26, the low resistance layer 72 and the polysilicon layer 70 may then be successively patterned to form word lines 78w in the word line region WR, a selection gate line 78s in the selection gate region SR, a high voltage gate electrode 78h in the high voltage region "c" and a low voltage gate electrode 78l in the low voltage region "d". As shown in FIG. 26, both the word lines 78w and the selection gate line 78s cross over the device isolation layers 56. The high voltage gate electrode 78h crosses over the second active region 60 and the low voltage gate electrode 78l crosses over the third active region 62. A charge storage insulation layer 74c that comprises a lower oxide layer 64, a charge trapping layer 66 and an upper oxide layer 68 is interposed between the gate lines 78w and the first active regions 58. This charge storage insulation layer may cover the entire top surface of the word line region WR. A high voltage gate insulation layer 74h is interposed between the high voltage gate electrode 78h and the second active region 60. This high voltage gate insulation layer 74h may comprise a stacked semiconductor structure that includes a patterned first oxide layer 52a, a patterned lower oxide layer 64a and a patterned second oxide layer 76a. A low voltage gate insulation layer 74l is similarly interposed between the low voltage gate electrode 78l and the third active region 62. This low voltage gate insulation layer 74l may comprise stacked semiconductor structure that includes a patterned lower insulation layer 64a and a patterned second oxide layer 76a.

FIGS. 27 through 32 are cross-sectional views showing non-volatile memory devices and methods of fabricating the same in accordance with third embodiments of the present invention. As shown in FIG. 27, a first pad insulation layer 53 is formed on the word line region WR of the cell region "b". This first pad insulation layer 53 comprises a pad oxide layer 53a and a pad nitride layer 53b that are sequentially stacked. The pad oxide layer 53a is also formed on the low voltage region "d" and on the selection gate region SR of the cell region "b". A first oxide layer 52 is formed on the high voltage region "c".

As shown in FIG. 28, device isolation layers 56 are next formed on a substrate to define a plurality of first active regions 58 in the cell region "b", a second active region 60 in the high voltage region "c", and a third active region 62 in the low voltage region "d". Then, the pad oxide layer 53a is removed from the low voltage region "d" and the selection gate region SR of the cell region "b". A portion of the first oxide layer 52 is etched to reduce the thickness of the first oxide layer 52. The pad oxide layer 53a in the word line region WR is not etched during the etch of the first oxide layer 52 because it is protected by the pad nitride layer 53b.

As shown in FIG. 29, a second oxide layer 86 may then be formed on the entire surface of the substrate 50. This second oxide layer 86 may then be removed from the word line WR portion of the cell region "b". The second oxide layer 86 may also be formed using a thermal oxidation process. When a thermal oxidation process is used, the second oxide layer 86 is not formed on the pad nitride layer 53b and the step of removing the second oxide layer 86 from the word line region WR is not required.

Next, a lower oxide layer 64, a charge trapping layer 66 and an upper oxide layer 68 are formed on an entire surface of the substrate 50. As shown in FIG. 30, the upper oxide layer 68 and the charge trapping layer 66 may be removed from the selection gate region SR of cell region "b", the high voltage region "c" and the low voltage region "d".

Figure 31:
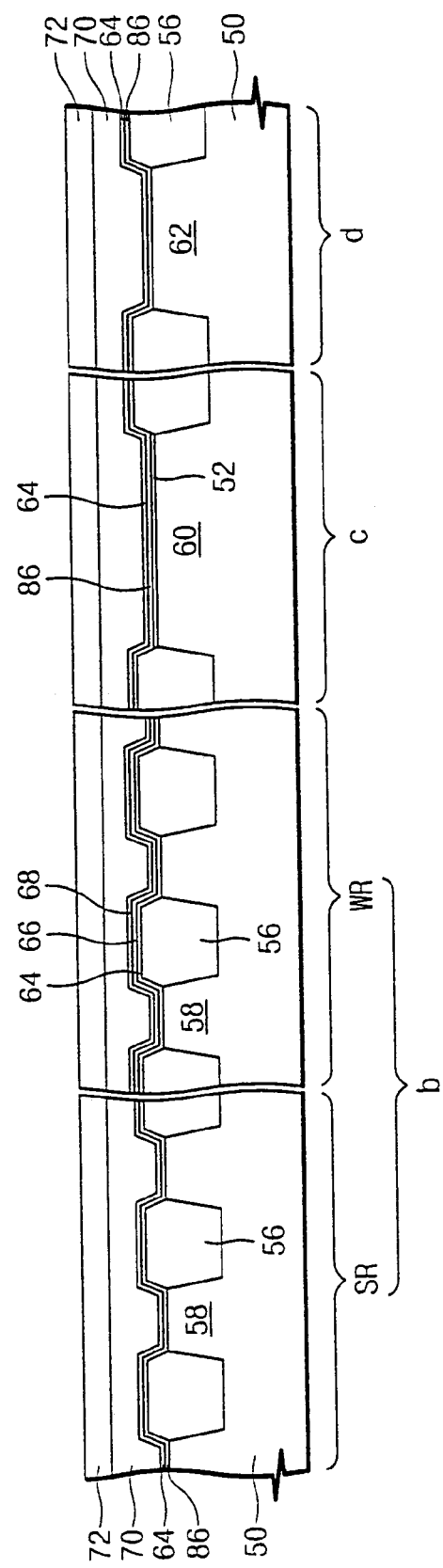

As shown in FIG. 31, thereafter a conductive layer may be formed on the entire surface of the substrate. This conductive layer may comprise a stacked low resistance layer 72 that is stacked on a polysilicon layer 70. The low resistance layer 72 may comprise, for example, a tungsten, tungsten silicide, titanium silicide or cobalt silicide layer.

Figure 32:
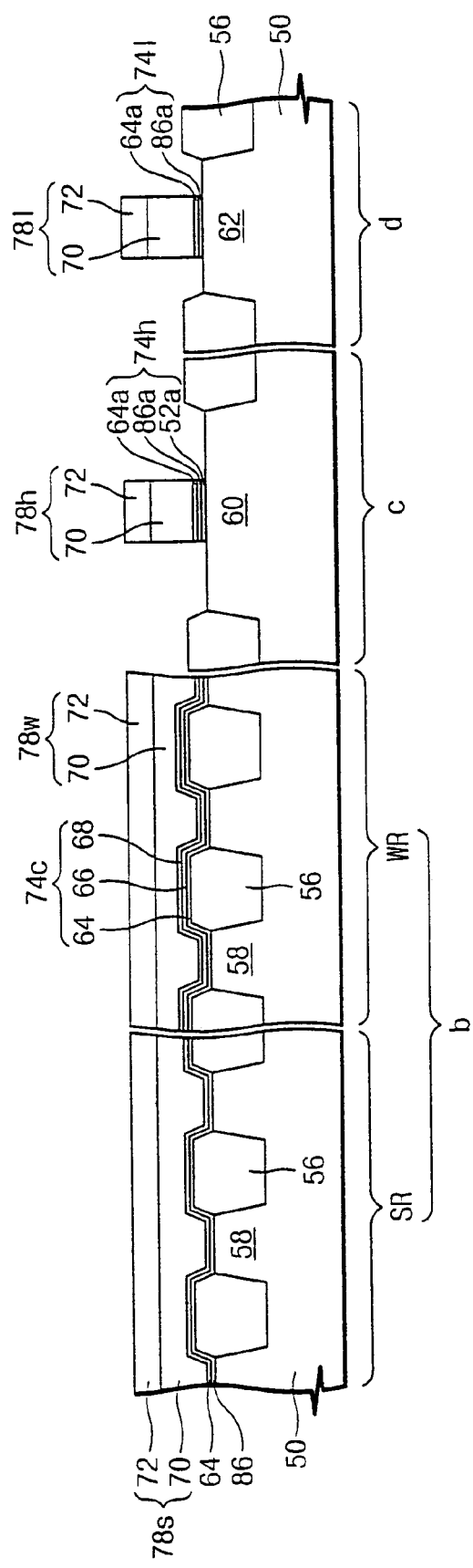

As shown in FIG. 32, the low resistance layer 72 and the polysilicon layer 70 are sequentially patterned to form (a) word lines 78w in the word line region WR, (b) a selection gate line 78s in the selection gate region SR, (c) a high voltage gate electrode 78h in the high voltage region "c" and (d) a low voltage gate electrode 78l in the low voltage region "d". Both the word lines 78w and the selection gate line 78s cross over the device isolation layers 56. The high voltage gate electrode 78h crosses over the second active region 60, and the low voltage gate electrode 78l crosses over the third active region 62. A charge storage insulator 74c, which comprises a lower oxide layer 64, a charge tapping layer 66 and an upper oxide layer 68, is interposed between the word lines 78w and the first active regions 58. The charge storage insulator 74c may cover the entire top surface of the word line region WR. A second oxide layer 86 and the upper oxide layer 64 are interposed between the selection gate line 78s and the first active regions 58 in the selection gate region SR. A high voltage gate insulation layer 74h is likewise interposed between the high voltage gate electrode 78h and the second active region 60. The high voltage gate insulation layer 74h may comprise a patterned first oxide layer 52a, a patterned second oxide layer 86a and a patterned lower oxide layer 64a. A low voltage gate insulation layer 74l is also interposed between the low voltage gate electrode 78l and the third active region 62. The low voltage gate electrode 78l may comprise a patterned second oxide layer 86a and a patterned lower oxide layer 64a.

Figure 33:
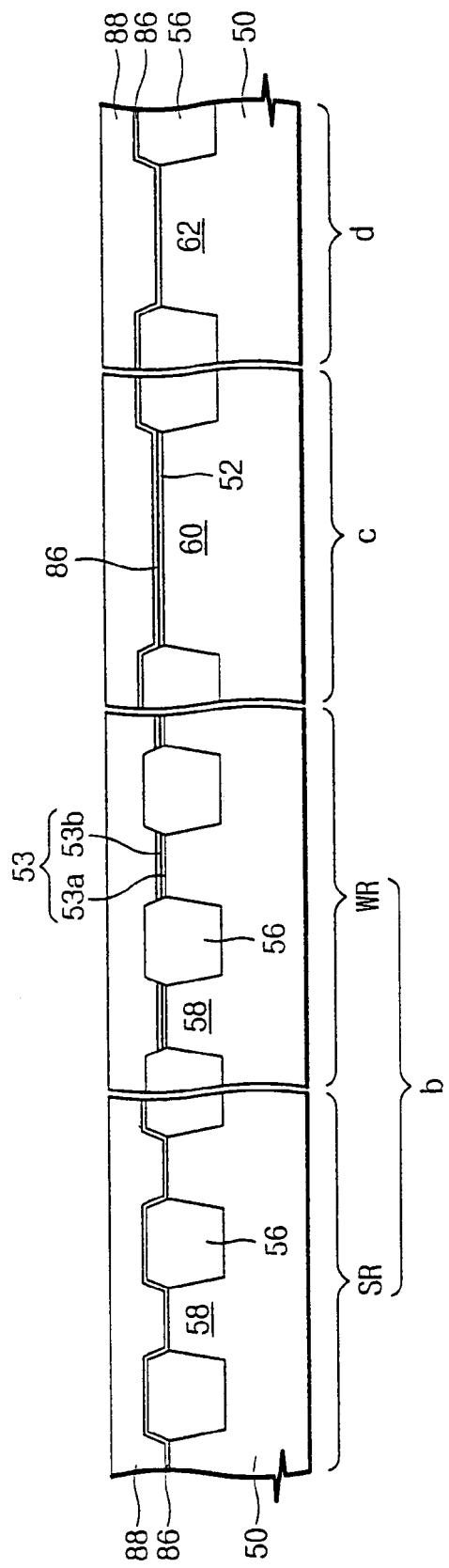
FIGS. 33 through 36 are cross-sectional views illustrating steps of fabricating non-volatile memory devices according to other embodiments of the present invention.

FIGS. 33 through 36 are cross-sectional views showing non-volatile memory devices and methods of fabricating the same in accordance with fourth embodiments of the present invention. In these embodiments, the fabrication steps discussed above with respect to FIGS. 27 through 29 are carried out to fabricate the structure depicted in FIG. 29. Then, as shown in FIG. 33, a first conductive layer 88 is formed on the second oxide layer 86 and the first pad insulation layer 53. This first conductive layer 88 may be formed of polysilicon.

Figure 34:
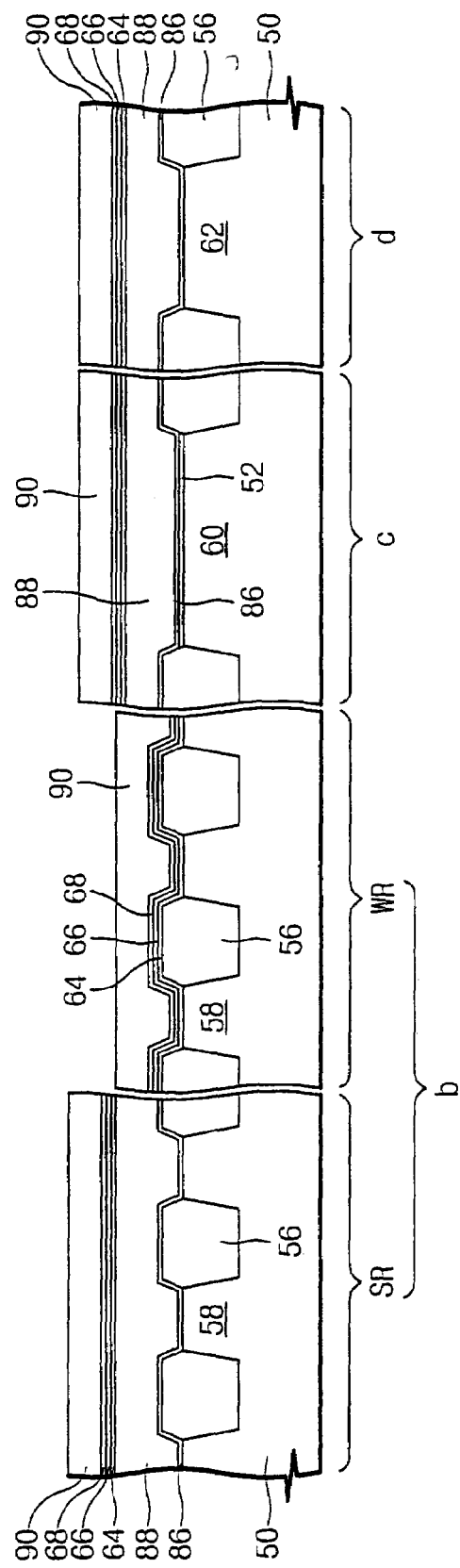

As shown in FIG. 34, the first conductive layer 88 and pad insulation layer 53 are then removed from the word line region WR of the cell region "b" to expose the first active regions 58. Then, a lower oxide layer 64, a charge trapping layer 66 and an upper oxide layer 68 are sequentially formed on the entire surface of the substrate 50. Next, a second conductive layer 90 is formed on the upper oxide layer 68. The second conductive layer 90 may also be formed of polysilicon.

Figure 35:
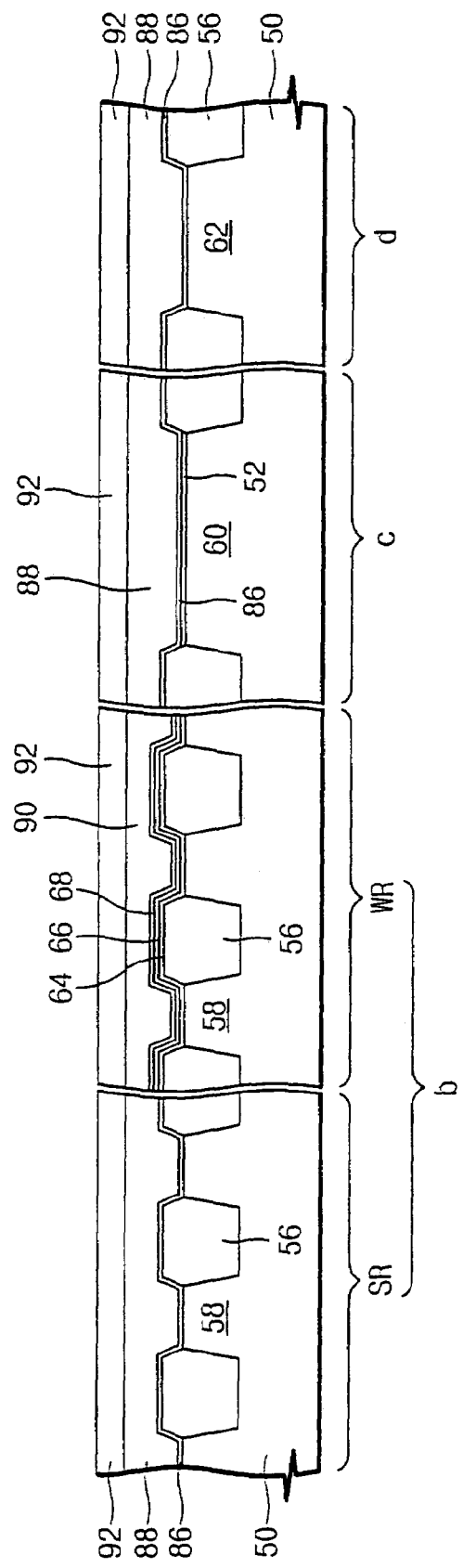

As shown in FIG. 35, the second conductive layer 90, the upper oxide layer 68, the charge trapping layer 66 and the lower oxide layer 64 are next removed from the selection gate region SR, the high voltage region "c" and the low voltage region "d". As a result, the word line WR is covered with second conductive layer 90, and the selection gate region SR, the high voltage region "c" and the low voltage region "d" are covered with the first conductive layer 88. A low resistance layer 92 is then formed on the entire surface of the substrate 50. The low resistance layer 92 may be, for example, a tungsten, tungsten silicide, titanium silicide or cobalt suicide layer. A polysilicon layer may be further formed on the entire surface of substrate.

Figure 36:
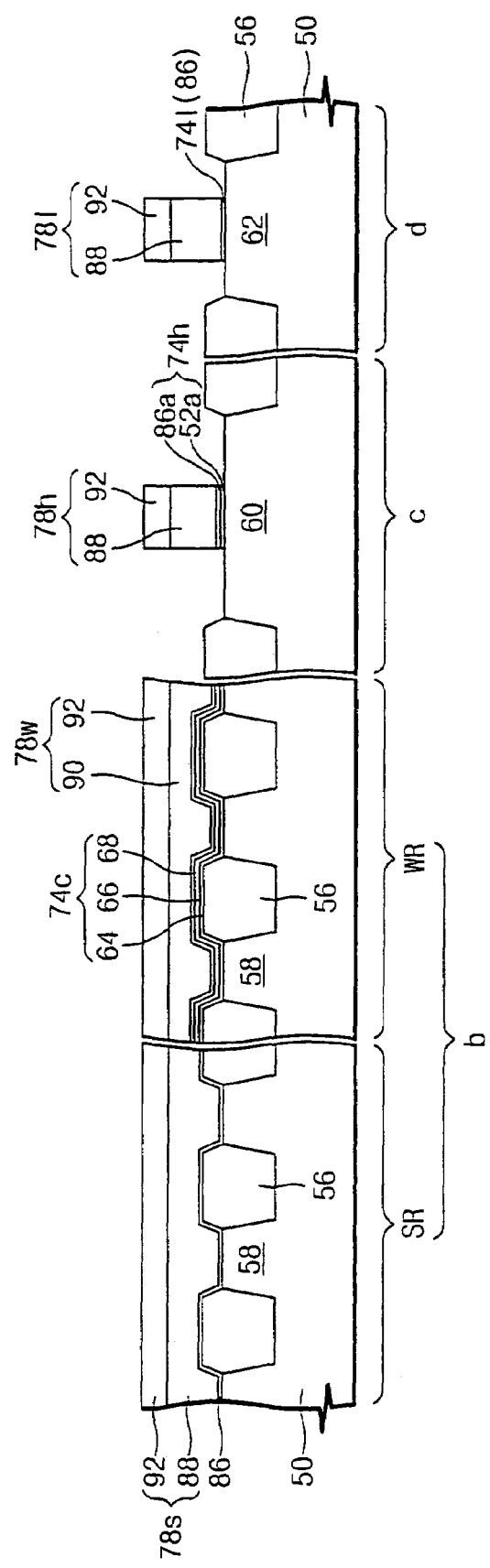

Referring next to FIG. 36, the low resistance layer 92 and the second conductive layer 90 are sequentially patterned in the word line region WR to form a plurality or parallel word lines 78w. The low resistance layer 92 and the first conductive layer 88 are patterned at the selection gate region SR to form selection gate lines 78s parallel to the word lines 78w. The low resistance layer 92 and the first conductive layer 88 are also patterned to form a high voltage gate electrode 78h in the high voltage region "c" and to form a a low voltage gate electrode 78l in the low voltage region "d". As shown in FIG. 36, a high voltage gate insulation layer 74h that may comprise a patterned first oxide layer 52a and a second oxide layer 86a is interposed between the high voltage gate electrode 78h and the second active region 60. A low voltage gate insulation layer 74l that is formed of a patterned second oxide layer is likewise interposed between the low voltage gate electrode 78h and the third active region 62.

FIGS. 37 through 41 are cross-sectional views showing non-volatile memory devices and methods of fabricating the same in accordance with fifth embodiments of the present invention. As shown in FIG. 37, a pad insulation layer 53 comprising a pad oxide layer 53a and a pad nitride layer 53b are formed on the substrate in the word line region WR of the cell region "b". A first oxide layer 52 is formed on the substrate in the high voltage region "c" and a second oxide layer 54 is formed on the substrate in the selection gate region SR of cell region "b" and in the low voltage region "d". Then, a first conductive layer 94 and a hard mask layer 95 are formed. The first conductive layer 94 may be formed of polysilicon and the hard mask layer 95 may be formed of silicon nitride.

As shown in FIG. 38, trench device isolation layers 56 are formed in the substrate 50 and then the hard mask layer 95 is removed. The device isolation layers 56 may be formed using self-aligned shallow trench isolation technology. The device isolation layers 56 define a plurality of first active regions 58 in the cell region "b", a second active region 60 in the high voltage region "c", and a third active region 62 in the low voltage region "d". A first conductive pattern 94a is formed on the active regions 58, 60 and 62. The first conductive pattern 94a is disposed between the device isolation layers 56 such that the sidewalls of each portion of the first conductive pattern 94a are in contact with the sidewalls of the adjacent device isolation layers 56.

Next, as shown in FIG. 39, the first conductive pattern 94a and the pad insulation layer 53 are removed from the word line region WR. A lower oxide layer 64, a charge trapping layer 66 and an upper oxide layer 68 are sequentially formed on the entire surface of the substrate. A second conductive layer 96 is formed on the upper oxide layer 68. The second conductive layer 96 may be formed of polysilicon.

Figure 40:
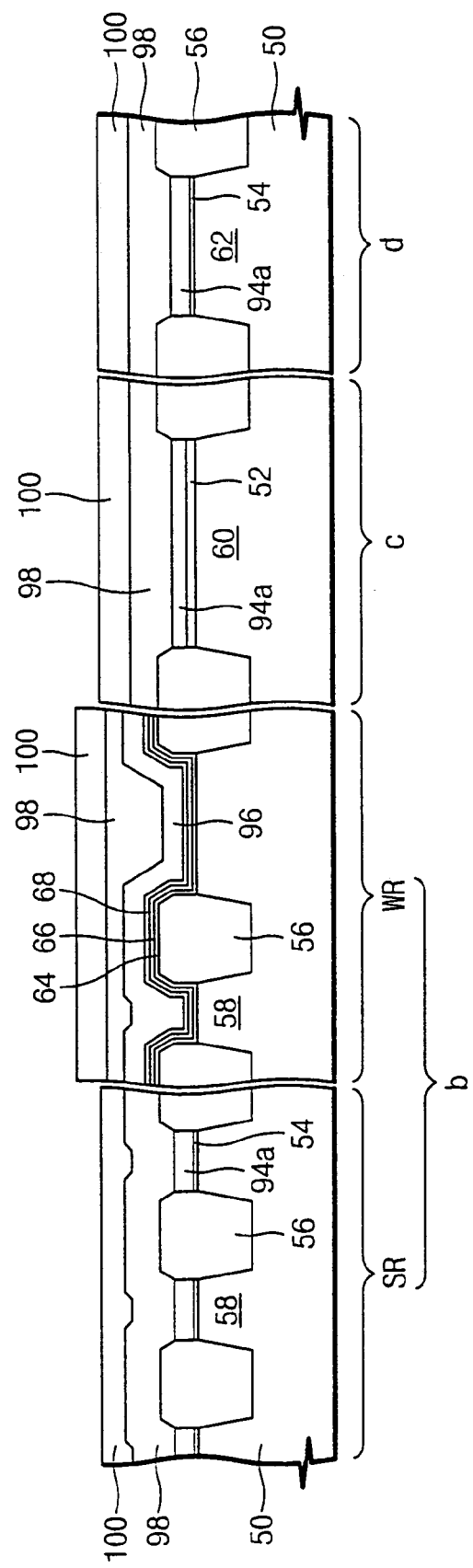

As shown in FIG. 40, the second conductive layer 96, the upper oxide layer 68, the charge trapping layer 66 and the lower oxide layer 64 are removed in the selection gate region SR, the high voltage region "c" and the low voltage region "d", thereby exposing the first conductive pattern 94a and the device isolation layers 56. A third conductive layer 98 and a low resistance layer 100 are formed on the entire surface of the substrate. The third conductive layer 98 may be formed of polysilicon and the low resistance layer 100 may be formed of tungsten, tungsten silicide, titanium silicide or cobalt silicide.

Figure 41:
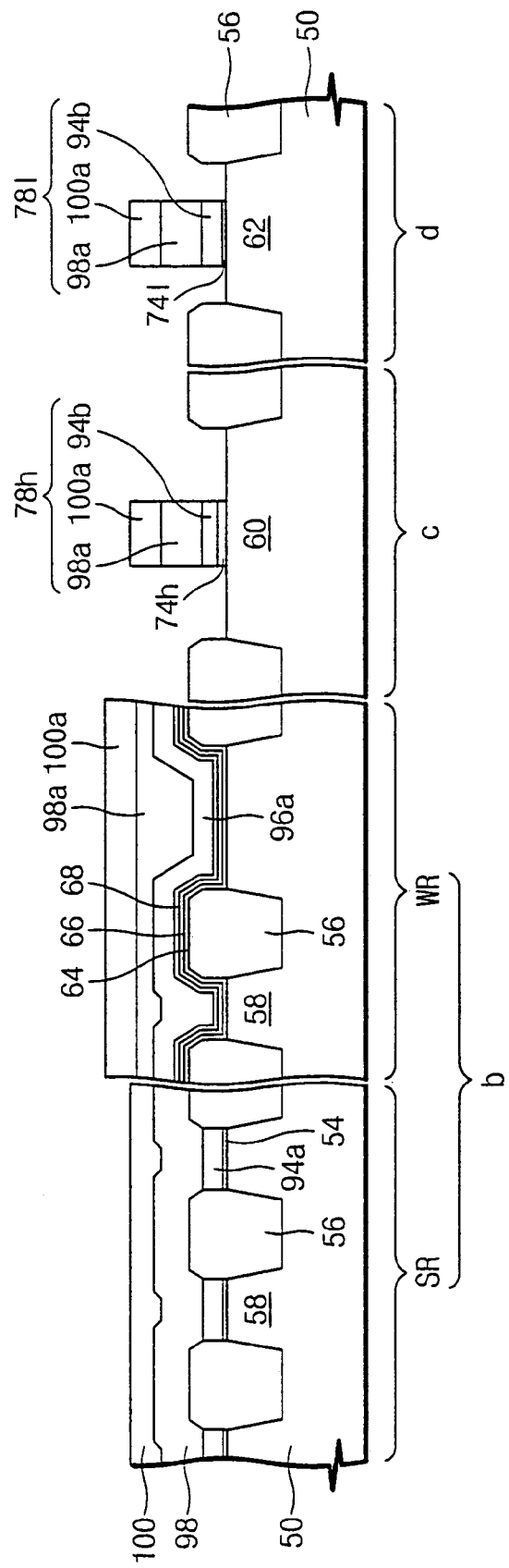

As shown in FIG. 41, the low resistance layer 100, the third conductive layer 98 and the second conductive layer 96 are patterned to form a plurality of parallel word lines in the word line region WR. The low resistance layer 100, the third conductive layer 98 and the conductive pattern 94a are patterned at the selection gate region SR to from selection gate lines in parallel to the word lines. The low resistance layer 100, the third conductive layer 98 and the first conductive patterns 94a are patterned in the high voltage region "c" and the low voltage region "d" to form a high voltage gate electrode 78h and a low voltage gate electrode 78l, respectively. In the embodiments depicted in FIG. 41, the gate lines 78w may be comprised of the second conductive pattern 96a, the third conductive pattern 98a, and the low resistance patterned layer 100a. The high voltage gate electrode 78h and the low voltage gate electrode 78l are triple layer structures comprising the first conductive pattern 94b, the third conductive pattern 98a and the low resistance patterned layer 100a. A high voltage gate insulation layer 74h that comprises a first oxide layer is interposed between the high voltage gate electrode 78h and the second active region 60. Likewise, a low voltage gate insulation layer 74l that comprises a second oxide layer is interposed between the low voltage gate electrode 78l and the third active region 62.

In the above-described embodiments of the present invention, the lower oxide layer 64 may be formed of, for example, silicon oxide, silicon oxynitride or metal oxide. The charge trapping layer 66 may be formed of silicon nitride or silicon oxynitride. The charge trapping layer 66 may be formed of material having etch selectivity with respect to the lower oxide layer. The upper oxide layer 68 may, for example, be formed of silicon oxide, silicon oxynitride or an insulate metal oxide such as aluminum oxide. In non-volatile memory devices according to embodiments of the present invention, the charge storage insulator 74c may cover the cell region or, alternately, may be disposed only under the gate lines. Likewise, the high voltage gate insulation layer 74h and the low voltage gate insulation layer 74l may be formed only under the gate electrode or also formed on the active region on both sides of the gate electrode.

According to embodiments of the present invention, a charge storage insulator comprising a plurality of layers may be formed not only on the active region of the device, but also on the entire surface of the cell region. Alternatively, the charge storage insulator may cross over the active region and the device isolation layers along the gate patterns. In addition, the charge storage insulator may be formed after forming the device isolation layers so that stress applied to the charge storage insulator can be remarkably reduced. Moreover, the most upper layer of the charge storage insulator may be formed of a metal oxide to minimize defects by using the metal oxide layer as an etch stop layer, while contact holes or grooves are formed by patterning the interlayer dielectric layer.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A non-volatile memory device comprising:
   a substrate having a plurality of isolation layers and a plurality of active regions therebetween;
   a charge storage insulator covering the plurality of active regions and the plurality of isolation layers; and
   a plurality of gate lines on the charge storage insulator.

2. The non-volatile memory device of claim 1, wherein a top surface of each of the plurality of isolation layers is disposed farther above the substrate than a top surface of each of the plurality of active regions.

3. The non-volatile memory device of claim 1, wherein the charge storage insulator comprises a multi-layer structure having at least one oxide layer.

4. The non-volatile memory device of claim 1, wherein the charge storage insulating layer comprises at least one insulating metal oxide layer.

5. The non-volatile memory device of claim 1, wherein the charge storage insulator comprises a lower oxide layer, a charge trapping layer disposed on the lower oxide layer and an insulating metal oxide layer disposed on the charge trapping layer.

6. A non-volatile memory device comprising:
   a substrate having a cell region, a high voltage region and a low voltage region;
   a plurality of trench isolation layers on the substrate that define a plurality of first active regions in the cell region, a plurality of second active regions in the high voltage region and a plurality of third active regions in the low voltage region;
   a charge storage insulator on the plurality of first active regions and the plurality of trench isolation layers in the cell region of the device;
   a plurality of gate lines on the charge storage insulator and crossing over the plurality of first active regions and the plurality of trench isolation layers in the cell region.

7. The non-volatile memory device of claim 6, the device further comprising:
   a high voltage gate electrode crossing over each of the plurality of second active regions and a first gate insulation layer interposed between the high voltage gate electrode and each of the plurality of second active regions;
   a low voltage gate electrode crossing over each of the plurality of third active regions and a second gate insulation layer interposed between the low voltage gate electrode and each of the plurality of third active regions.

8. The non-volatile memory device of claim 7, wherein the first gate insulation layer is thicker than the second gate insulation layer.

9. The non-volatile memory device of claim 6, wherein a top surface of each of the plurality of trench isolation layers is higher than a top surface of each of the plurality of first, second and third active regions.

10. The non-volatile memory device of claim 6, wherein the charge storage insulator is a multi-layer structure that includes an insulating metal oxide layer.

11. A non-volatile memory device comprising:
    a substrate having a cell region;

a plurality of trench isolation layers that define a plurality of first active regions in the cell region, a plurality of second active regions in a high voltage region and a plurality of third active regions in a low voltage region;

a charge storage insulator on the plurality of first active regions and the plurality of trench isolation layers in the cell region;

a plurality of gate lines on the charge storage insulator and crossing over the plurality of trench isolation layers in the cell region;

a high voltage gate electrode crossing over each of the plurality of second active regions and a first gate insulation layer interposed between the high voltage gate electrode and each of the plurality of second active regions; and a low voltage gate electrode crossing over each of the plurality of third active regions and a second gate insulation layer interposed between the low voltage gate electrode and each of the plurality of third active regions;

wherein the first gate insulation layer is thicker than the second gate insulation layer; and wherein the first gate insulation layer comprises a first oxide layer and a lower oxide layer and wherein the second gate insulation layer comprises a second oxide layer and a lower oxide layer.

12. The non-volatile memory device of claim 11, wherein the plurality of gate lines include a plurality of word lines, a ground selection gate line and a string selection gate line and wherein the second oxide layer is further interposed between the charge storage insulator and the first active region are under the ground and string selection gate lines.

13. The non-volatile memory device of claim 12, wherein the plurality of gate lines include a plurality of word lines, a ground selection gate line and a string selection gate line and wherein the lower oxide layer is further interposed between the string selection gate line and the plurality of first active regions, and between the ground selection gate line and the plurality of first active regions.

14. The non-volatile memory device of claim 11, wherein the charge storage insulator comprises a lower oxide layer, a charge trapping layer disposed on the lower oxide layer and an upper oxide layer disposed on the charge trapping layer.

15. A non-volatile memory device comprising:
a substrate having a cell region;
a plurality of trench isolation layers on the substrate that define a plurality of first active regions in a cell region, a plurality of second active regions in a high voltage region and a plurality of third active regions in the low voltage region;
a charge storage insulator on the plurality of first active regions and the plurality of trench isolation layers in the cell region;
a plurality of gate lines on the charge storage insulator and crossing over the plurality of trench isolation layers in the cell region;
a high voltage gate electrode crossing over each of the plurality of second active regions and a first gate insulation layer interposed between the high voltage gate electrode and each of the plurality of second active regions; and
a low voltage gate electrode crossing over each of the plurality of third active regions and a second gate insulation layer interposed between the low voltage gate electrode and each of the plurality of third active regions;
wherein the first gate insulation layer comprises a first oxide layer, a lower oxide layer and a second oxide layer and wherein the second gate insulation layer comprises the lower oxide layer and the second oxide layer.

16. The non-volatile memory device of claim 15, wherein the first insulation layer and the second insulation layer each further comprise an upper oxide layer on the second oxide layer.

17. The non-volatile memory device of claim 16, wherein the charge storage insulator comprises the lower oxide layer, a charge trapping layer disposed on the lower oxide layer and the upper oxide layer disposed on the charge trapping layer.

18. A non-volatile memory device comprising:
a substrate having a cell region;
a plurality of trench isolation layers on the substrate that define a plurality of first active regions in the cell region, a plurality of second active regions in a high voltage region and a plurality of third active regions in a low voltage region;
a charge storage insulator on the plurality of first active regions and the plurality of trench isolation layers in the cell region;
a plurality of gate lines on the charge storage insulator and crossing over the plurality of trench isolation layers in the cell region;
a high voltage gate electrode crossing over each of the plurality of second active regions and a first insulation layer interposed between the high voltage gate electrode and each of the plurality of second active regions; and
a low voltage gate electrode crossing over each of the plurality of third active regions and a second insulation layer interposed between the low voltage gate electrode and each of the plurality of third active region;
wherein the first insulation layer comprises a first oxide layer and a second oxide layer and wherein the second insulation layer comprises the second oxide layer.

19. The non-volatile memory device of claim 18, wherein each of the plurality of gate lines comprises a second conductive layer and a third conductive layer and wherein the high and low voltage gate electrodes comprise the first conductive layer and the third conductive layer.

20. A non-volatile memory device comprising:
a substrate having a cell region;
a plurality of device isolation layers that define a plurality of first active regions in a cell region, a second active region in a high voltage region and a third active region in a low voltage region;
a charge storage insulator disposed on the first active regions and the plurality of device isolation layers wherein the charge storage insulator comprises a lower oxide layer, a charge trapping layer and an tipper oxide layer;
a plurality of gate lines on the charge storage insulator;
a first gate electrode crossing over the second active region;
a second gate electrode crossing over the third active region;
a first gate insulation layer interposed between the first gate electrode and the second active region; and
a second gate insulation layer interposed between the second gate electrode and the third active region.

21. The non-volatile memory device of claim 20, wherein the plurality of gate lines include a plurality of word lines disposed in a word line portion of the cell region, and a ground selection gate line and a string selection gate line that are disposed in a selection gate portion of the cell region and wherein the lower oxide layer of the charge storage insulator is thinner under the plurality of word lines than the lower oxide layer of the charge storage insulator is under the ground selection gate line and the string selection gate line.

22. The non-volatile memory device of claim 20, wherein the upper oxide layer comprises an insulating metal oxide layer.

23. The non-volatile memory device of claim 20, wherein the lower oxide layer comprises an insulating metal oxide layer.

24. The non-volatile memory device of claim 20, wherein the first gate insulation layer is thicker than the second gate insulation layer.

25. A non-volatile memory device comprising:
   a substrate having a plurality of isolation layers and a plurality of active regions therebetween;
   a charge storage insulator on the plurality of active regions and the plurality of isolation layer;
   a plurality of gate lines on the charge storage insulator and crossing over the plurality of active region; and
   a plurality of conductive patterns disposed between at least some of the gate lines that penetrate the charge storage insulator to electrically connect with at least some of the plurality of active regions.

26. The non-volatile memory device of claim 25, wherein a top surface of each of the plurality of isolation layers is disposed farther above the substrate than a top surface of each of the plurality of active regions.

27. The non-volatile memory device of claim 25, wherein the charge storage insulator comprises a multi-layer structure having at least one oxide layer.

28. The non-volatile memory device of claim 25, wherein the charge storage insulator comprises at least one insulating metal oxide layer.

29. The non-volatile memory device of claim 25, wherein the charge storage insulator comprises a lower oxide layer, a charge trapping layer disposed on the lower oxide layer and an insulating metal oxide layer disposed on the charge trapping layer.

30. The non-volatile memory device of claim 25, wherein the plurality of isolation layers and the plurality of active regions are located in a cell region of the device and wherein the charge storage insulator is on substantially the entire surface of the cell region.

31. A non-volatile memory device comprising:
   a substrate having a plurality of isolation layers and a plurality of active regions therebetween;
   a charge storage insulator on the plurality of active regions and the plurality of isolation layers;
   wherein the charge storage insulator comprises a multi-layer structure having at least one insulating metal oxide layer; and
   a plurality of gate lines on the charge storage insulator and crossing over the plurality of active regions.

32. The non-volatile memory device of claim 31, wherein the charge storage insulator comprises a lower oxide layer, a charge trapping layer disposed on the lower oxide layer and an insulating metal oxide layer disposed on the charge trapping layer.

33. The non-volatile memory device of claim 32, wherein the lower oxide layer comprises an insulating metal oxide layer.

* * * * *

UNITED STATES PATENT AND TRADEMARK OFFICE
CERTIFICATE OF CORRECTION

PATENT NO. : 6,995,424 B2
APPLICATION NO. : 10/712426
DATED : February 7, 2006
INVENTOR(S) : Lee It is certified that error appears in the above-identified patent and that said Letters Patent is hereby corrected as shown below:

Column 16,
Line 54 should read -- oxide layer, a charge trapping layer and an upper oxide --

Signed and Sealed this

First Day of August, 2006

JON W. DUDAS
*Director of the United States Patent and Trademark Office*